United States Patent
Fang et al.

(10) Patent No.: US 8,872,176 B2
(45) Date of Patent: Oct. 28, 2014

(54) ELASTIC ENCAPSULATED CARBON NANOTUBE BASED ELECTRICAL CONTACTS

(75) Inventors: Treliant Fang, Dublin, CA (US); John K. Gritters, Livermore, CA (US); Onnik Yaglioglu, Emeryville, CA (US)

(73) Assignee: FormFactor, Inc., Livermore, CA (US)

( * ) Notice: Subject to any disclaimer, the term of this patent is extended or adjusted under 35 U.S.C. 154(b) by 230 days.

(21) Appl. No.: 13/253,665

(22) Filed: Oct. 5, 2011

(65) Prior Publication Data

US 2012/0086004 A1 Apr. 12, 2012

Related U.S. Application Data

(60) Provisional application No. 61/390,401, filed on Oct. 6, 2010.

(51) Int. Cl.
*H01L 23/58* (2006.01)
*H01L 29/10* (2006.01)
*B82Y 10/00* (2011.01)
*G01R 1/067* (2006.01)
*G01R 31/28* (2006.01)

(52) U.S. Cl.
CPC ........ *G01R 1/06744* (2013.01); *G01R 31/2886* (2013.01); *B82Y 10/00* (2013.01); *H01L 2224/13* (2013.01); *H01L 2924/00013* (2013.01)
USPC .......................................................... 257/48

(58) Field of Classification Search
CPC ....... H01L 33/46; H01L 21/283; H01L 33/20; H01L 33/58; H01L 51/0074; H01L 24/66
USPC .......................................................... 257/48
See application file for complete search history.

(56) References Cited

U.S. PATENT DOCUMENTS

| | | | |
|---|---|---|---|
| 5,366,380 A | 11/1994 | Reymond | |
| 5,741,144 A | 4/1998 | Elco et al. | |

(Continued)

FOREIGN PATENT DOCUMENTS

| | | |
|---|---|---|
| EP | 1830367 | 9/2007 |
| EP | 1845124 | 10/2007 |

(Continued)

OTHER PUBLICATIONS

Hutchens et al., "In situ Mechanical Testing Reveals Periodic Buckle Nucleation and Propagation in Carbon Nanotube Bundles," Adv. Funct. Mater. 2010, 20 (Wiley-VCH Verlag GmbH & Co.) (2010), pp. 2338-2346.

(Continued)

*Primary Examiner* — Stephen W Smoot
*Assistant Examiner* — Vicki B Booker
(74) *Attorney, Agent, or Firm* — Kirton McConkie

(57) ABSTRACT

Contacts of an electrical device can be made of carbon nanotube columns. Contact tips can be disposed at ends of the columns. The contact tips can be made of an electrically conductive paste applied to the ends of the columns and cured (e.g., hardened). The paste can be applied, cured, and/or otherwise treated to make the contact tips in desired shapes. The carbon nanotube columns can be encapsulated in an elastic material that can impart the dominant mechanical characteristics, such as spring characteristics, to the contacts. The contacts can be electrically conductive and can be utilized to make pressure-based electrical connections with electrical terminals or other contact structures of another device.

27 Claims, 15 Drawing Sheets

(56) References Cited

U.S. PATENT DOCUMENTS

| | | | |
|---|---|---|---|
| 5,829,128 | A | 11/1998 | Eldridge et al. |
| 5,903,161 | A | 5/1999 | Amemiya et al. |
| 6,020,747 | A | 2/2000 | Bahns et al. |
| 6,031,711 | A | 2/2000 | Tennent et al. |
| 6,184,053 | B1 | 2/2001 | Eldridge et al. |
| 6,232,706 | B1 | 5/2001 | Dai et al. |
| 6,346,189 | B1 | 2/2002 | Dai et al. |
| 6,379,982 | B1 | 4/2002 | Ahn et al. |
| 6,401,526 | B1 | 6/2002 | Dai et al. |
| 6,457,350 | B1 | 10/2002 | Mitchell |
| 6,597,090 | B1 | 7/2003 | Mancevski |
| 6,626,684 | B1 | 9/2003 | Stickler et al. |
| 6,636,050 | B2 | 10/2003 | Nakayama et al. |
| 6,653,208 | B2 | 11/2003 | Ahn et al. |
| 6,709,566 | B2 | 3/2004 | Cumings et al. |
| 6,790,684 | B2 | 9/2004 | Ahn et al. |
| 6,791,171 | B2 | 9/2004 | Mok et al. |
| 6,800,865 | B2 | 10/2004 | Nakayama et al. |
| 6,815,961 | B2 | 11/2004 | Mok et al. |
| 6,863,942 | B2 | 3/2005 | Ren et al. |
| 6,869,671 | B1 | 3/2005 | Crouse et al. |
| 6,870,361 | B2 | 3/2005 | Chopra et al. |
| 6,890,506 | B1 | 5/2005 | Harutyunyan et al. |
| 6,900,479 | B2 | 5/2005 | DeHon et al. |
| 6,933,222 | B2 | 8/2005 | Dubin et al. |
| 6,945,827 | B2 | 9/2005 | Grube et al. |
| 6,967,013 | B2 | 11/2005 | Someya et al. |
| 6,979,244 | B2 | 12/2005 | Den et al. |
| 7,012,441 | B2 | 3/2006 | Chou et al. |
| 7,057,402 | B2 | 6/2006 | Cole et al. |
| 7,082,683 | B2 | 8/2006 | Han et al. |
| 7,094,123 | B2 | 8/2006 | Oyama et al. |
| 7,132,039 | B2 | 11/2006 | Anazawa et al. |
| 7,147,966 | B2 | 12/2006 | Ren et al. |
| 7,160,531 | B1 | 1/2007 | Jacques et al. |
| 7,189,430 | B2 | 3/2007 | Ajayan et al. |
| 7,226,663 | B2 | 6/2007 | Jiao et al. |
| 7,242,012 | B2 | 7/2007 | Leedy |
| 7,250,188 | B2 | 7/2007 | Dodelet et al. |
| 7,251,884 | B2 | 8/2007 | Grube et al. |
| 7,258,901 | B1 | 8/2007 | Lee et al. |
| 7,349,223 | B2 | 3/2008 | Haemer et al. |
| 7,378,328 | B2 | 5/2008 | Choi et al. |
| 7,400,159 | B2 | 7/2008 | Wang et al. |
| 7,439,731 | B2 | 10/2008 | Crafts et al. |
| 7,443,185 | B2 * | 10/2008 | Suhir ........................ 324/750.01 |
| 7,585,548 | B2 | 9/2009 | Wang et al. |
| 7,671,397 | B2 | 3/2010 | Fujita et al. |
| 7,687,981 | B2 | 3/2010 | Parsapour |
| 7,710,106 | B2 * | 5/2010 | Crafts et al. .............. 324/756.03 |
| 7,731,503 | B2 | 6/2010 | Eldridge et al. |
| 7,777,291 | B2 | 8/2010 | Kabir |
| 8,130,007 | B2 | 3/2012 | Eldridge et al. |
| 8,149,007 | B2 | 4/2012 | Chen et al. |
| 2003/0010910 | A1 | 1/2003 | Colbert et al. |
| 2003/0153965 | A1 | 8/2003 | Supronowicz et al. |
| 2003/0165418 | A1 | 9/2003 | Ajayan et al. |
| 2003/0179559 | A1 | 9/2003 | Engelhardt et al. |
| 2003/0189235 | A1 | 10/2003 | Watanabe et al. |
| 2004/0036403 | A1 | 2/2004 | Ouo et al. |
| 2004/0106218 | A1 | 6/2004 | Wang et al. |
| 2004/0110003 | A1 | 6/2004 | Cumings et al. |
| 2004/0113621 | A1 | 6/2004 | Naughton |
| 2004/0173506 | A1 | 9/2004 | Doktycz et al. |
| 2004/0175850 | A1 | 9/2004 | Shimizu et al. |
| 2004/0208788 | A1 | 10/2004 | Colton |
| 2004/0211589 | A1 | 10/2004 | Chou et al. |
| 2005/0019245 | A1 | 1/2005 | Koulikov |
| 2005/0022376 | A1 | 2/2005 | Alcoe |
| 2005/0092464 | A1 | 5/2005 | Leu et al. |
| 2005/0285116 | A1 | 12/2005 | Wang |
| 2006/0028220 | A1 | 2/2006 | Malantonio et al. |
| 2006/0071334 | A1 | 4/2006 | Kawabata et al. |
| 2006/0073089 | A1 | 4/2006 | Ajayan et al. |
| 2006/0103406 | A1 | 5/2006 | Kitazawa et al. |
| 2006/0188721 | A1 | 8/2006 | Irvin et al. |
| 2006/0197547 | A1 | 9/2006 | Chen |
| 2006/0198956 | A1 | 9/2006 | Eres |
| 2006/0252853 | A1 | 11/2006 | Ajayan et al. |
| 2007/0004191 | A1 | 1/2007 | Gu et al. |
| 2007/0018098 | A1 | 1/2007 | Nakayama et al. |
| 2007/0051887 | A1 | 3/2007 | Hidaka et al. |
| 2007/0155158 | A1 | 7/2007 | Gstrein et al. |
| 2007/0158584 | A1 | 7/2007 | Lin |
| 2007/0158768 | A1 | 7/2007 | Pilchowski et al. |
| 2007/0164214 | A1 | 7/2007 | Choi et al. |
| 2007/0186665 | A1 | 8/2007 | Hierold et al. |
| 2007/0213419 | A1 | 9/2007 | Cao et al. |
| 2007/0218202 | A1 | 9/2007 | Ajayan et al. |
| 2007/0235713 | A1 | 10/2007 | Swirbel |
| 2007/0237990 | A1 | 10/2007 | Kim |
| 2007/0253889 | A1 | 11/2007 | Awano et al. |
| 2008/0067494 | A1 | 3/2008 | Mammana et al. |
| 2009/0053859 | A1 | 2/2009 | Xu et al. |
| 2009/0091343 | A1 | 4/2009 | Wu et al. |
| 2010/0083489 | A1 | 4/2010 | Eldridge et al. |
| 2010/0252317 | A1 | 10/2010 | Gritters et al. |
| 2010/0253375 | A1 | 10/2010 | Fang et al. |
| 2011/0018566 | A1 | 1/2011 | Crafts et al. |

FOREIGN PATENT DOCUMENTS

| | | |
|---|---|---|
| JP | 2004286570 | 10/2004 |
| WO | WO 00/73204 | 12/2000 |
| WO | WO 03/004155 | 1/2003 |
| WO | WO 2004/102582 | 11/2004 |
| WO | WO 2005/017977 | 2/2005 |
| WO | WO 2006/057659 | 6/2006 |
| WO | WO 2007/033188 | 3/2007 |
| WO | WO 2007/139244 | 12/2007 |

OTHER PUBLICATIONS

Yaglioglu et al., "Method of Characterizing Electrical Contact Properties of Carbon Nanotube Coated Surfaces," Review of Scientific Instruments 77, 095105 (American Institute of Physics 2006), 3 pages.

Andrews et al., "Continuous production of aligned carbon nanotubes: a step closer to commercial realization," Chemical Physics Letters 303 (Apr. 16, 1999), pp. 467-474.

Chen et al., "Nanoscale Molecular-Switch Devices Fabricated by Imprint Lithography", Applied Physics Letters, Mar. 10, 2003, pp. 1610-1612, vol. 82.

Greene, "Researchers Make Carbon Nanotubes Without Metal Catalyst," MIT News (Aug. 10, 2009) (2 pages).

Lau et al., "Superhydrophobic Carbon Nanotube Forrests", Nano Letters, Dept. of Chemical Engineering, pp. 1-21, Massachusetts Institute of Technology, Cambridge, MA, 2003, vol. 3, No. 12.

Moloni et al., "Sharpened Carbon Nanotube Probes" (University of Wisconsin-Madison) (no date but downloaded from Internet on Sep. 6, 2007) (8 pages).

Pushparaj et al., "Effects of compressive strains on electrical conductivities of a macroscale carbon nanotube block," Applied Physics Letters 91, 153116 (2007) (3 pages).

Wei et al., "Growing Pillars of Densely Packed Carbon Nanotubes on Ni-coated Silica", Carbon, 2002, Oct. 23, 2000, pp. 47-51, vol. 40.

Yaglioglu et al., "Conductive Carbon Nanotube Composite Microprobes," Advanced Materials (2008), pp. 357-362.

Yaglioglu et al., "Transfer and Reinforcement of Carbon Nanotube Structures with Epoxy," Precision Engineering Research Group, Dept. of Mechanical Engineering, Massachusetts Institute of Technology (presented at NTOG conference in Japan, Jun. 2006) (1 page).

Yaglioglu, "Carbon Nanotube Based Electromechanical Probes," Thesis (Massachusetts Institute of Technology Jun. 2007) (137 pages).

* cited by examiner

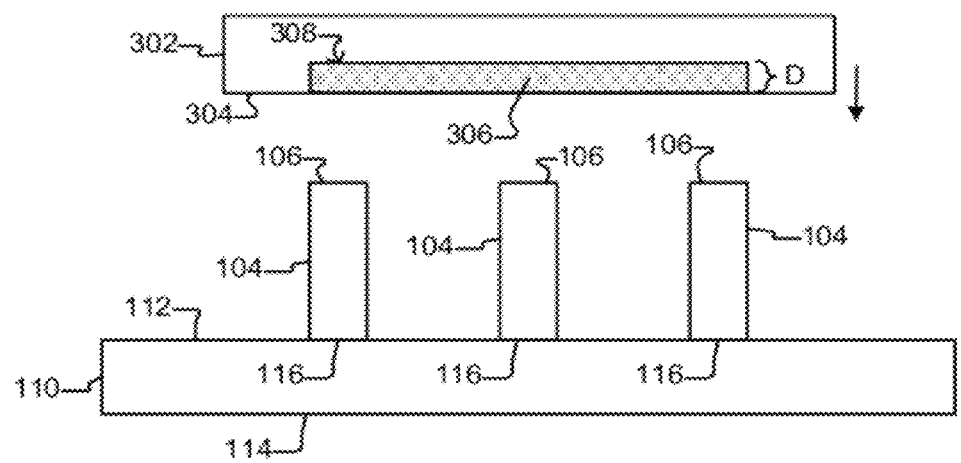
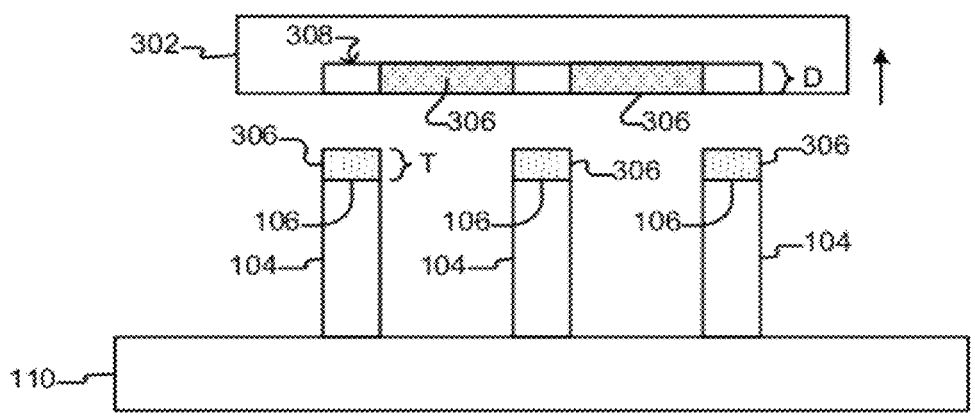

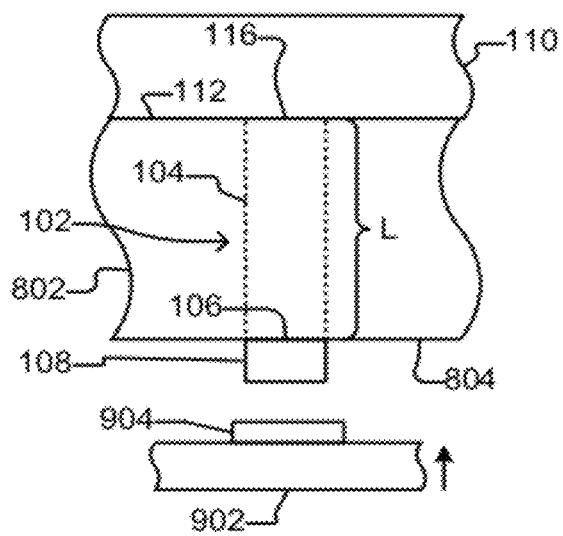
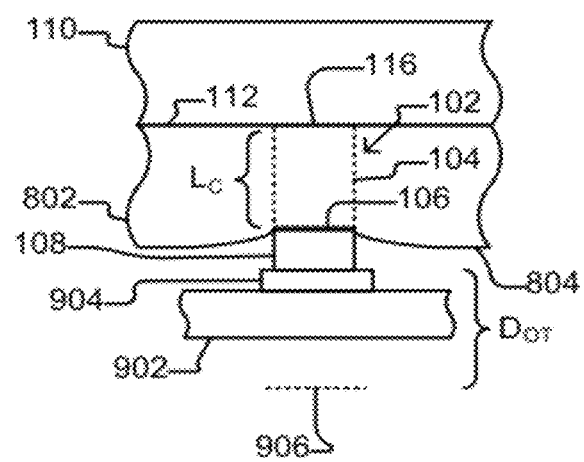

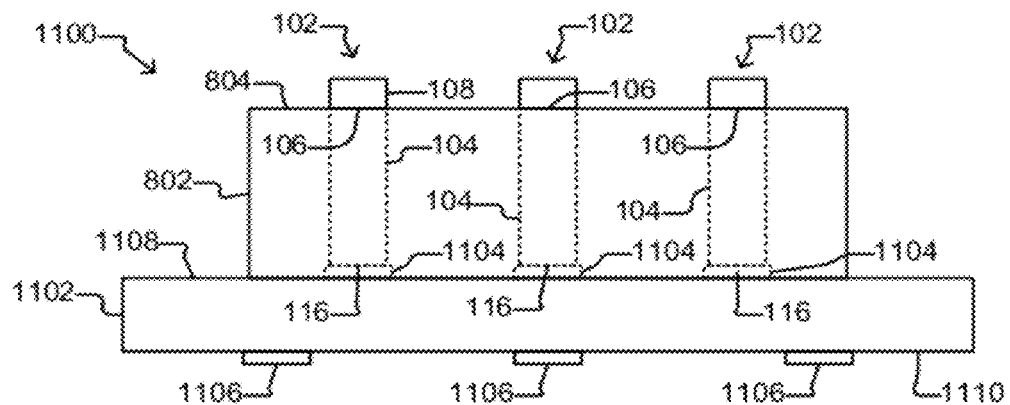
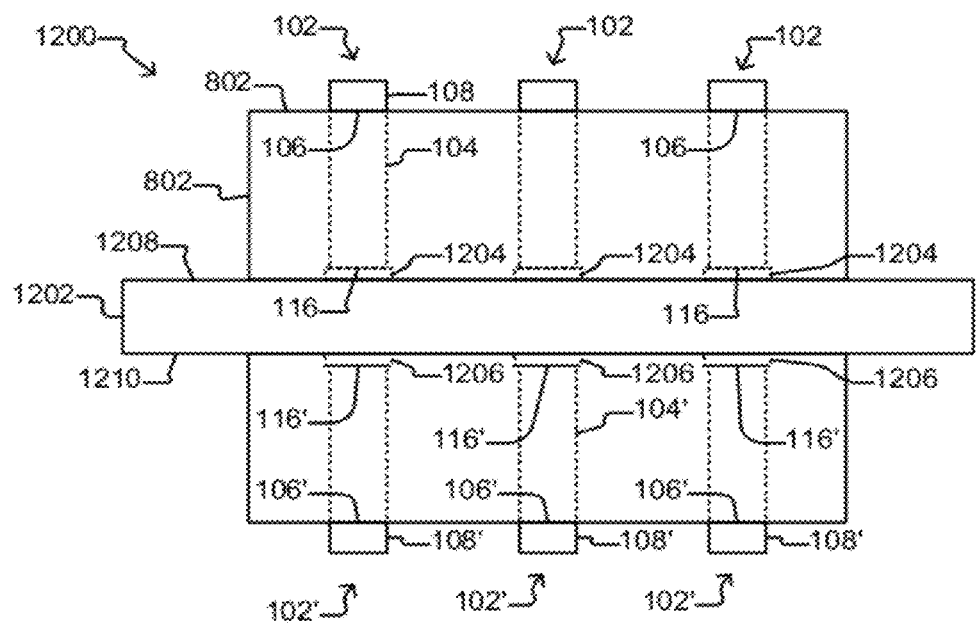

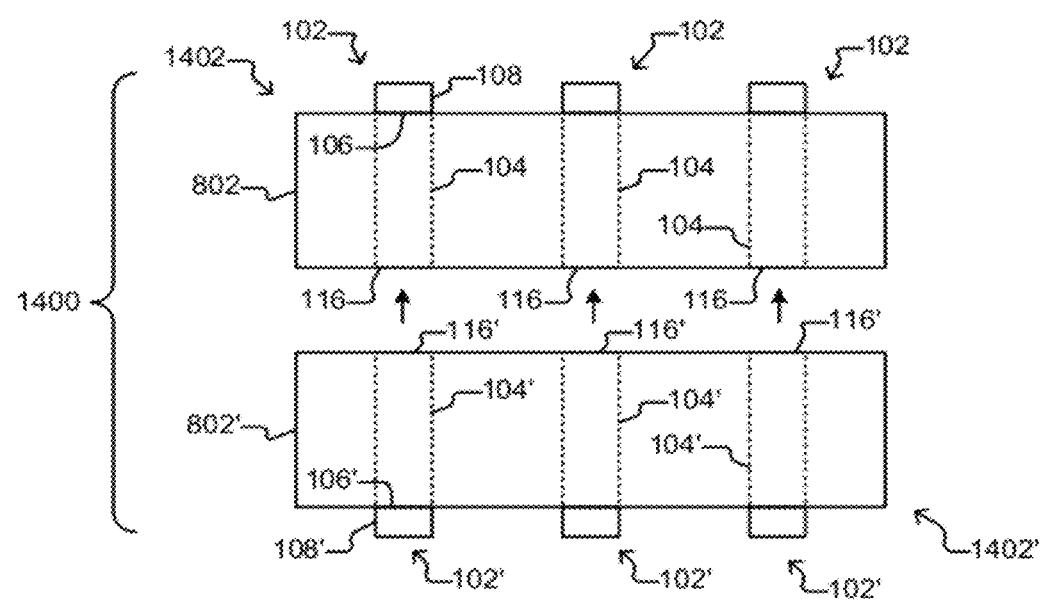

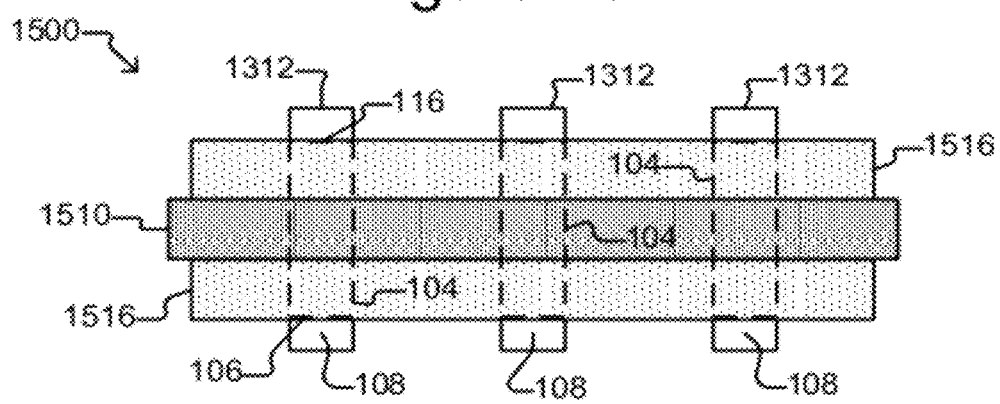

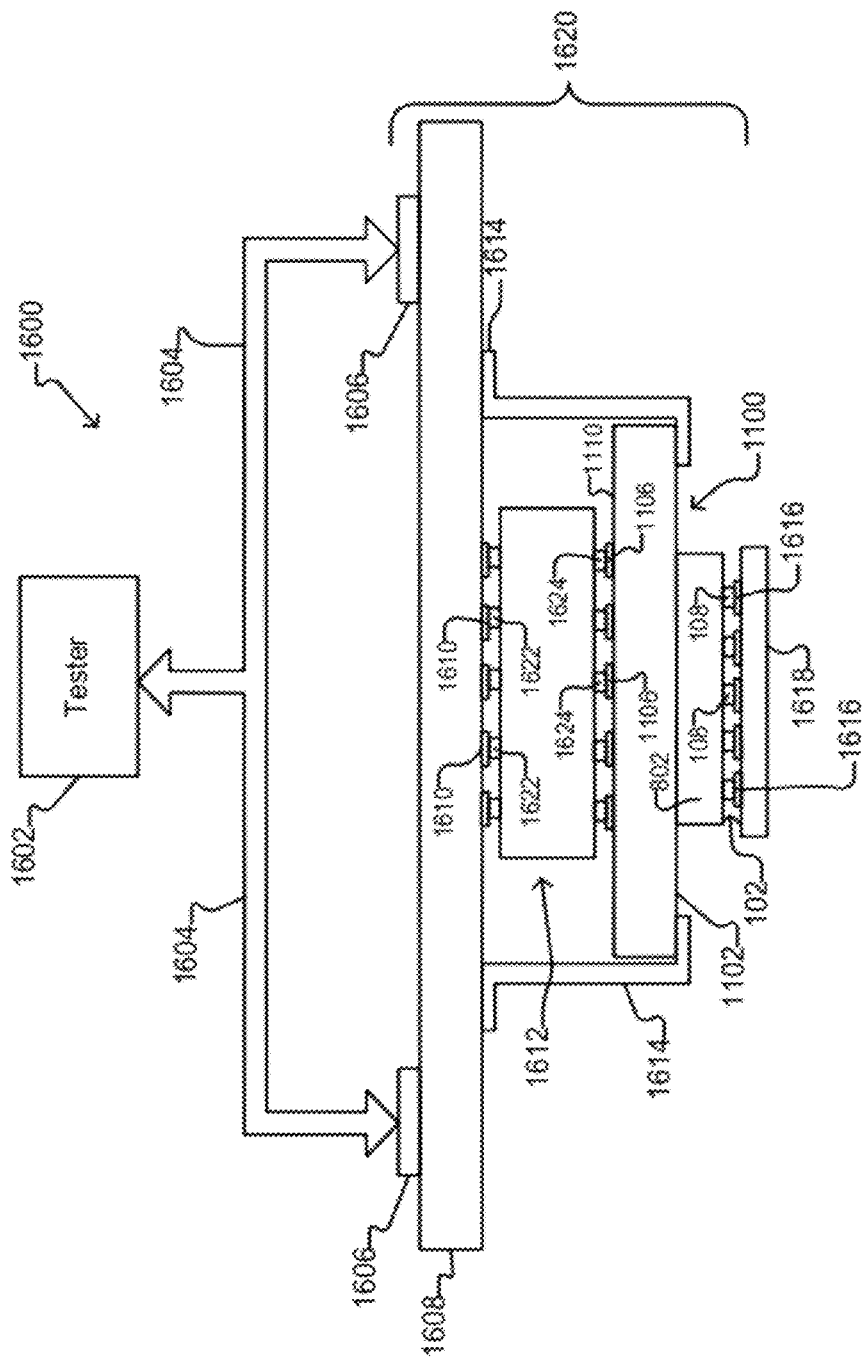

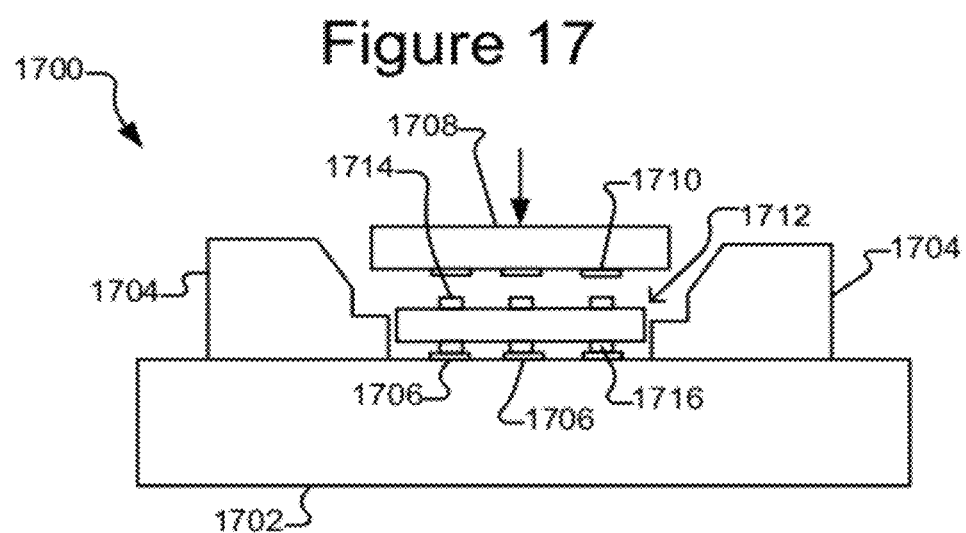

ELASTIC ENCAPSULATED CARBON NANOTUBE BASED ELECTRICAL CONTACTS

CROSS REFERENCE TO RELATED APPLICATION(S)

This application is a non-provisional (and thus claims the benefit of the filing date) of U.S. provisional patent application Ser. No. 61/390,401 (filed Oct. 6, 2010), which is incorporated herein by reference in its entirety.

BACKGROUND

Electrically conductive contacts on an electronic device can make temporary, pressure based electrical connections with terminals or other such input and/or outputs of a second electronic device. For example, such contacts on the electronic device can be pressed against the terminals of the second electronic device to make temporary electrical connections between the contacts and the terminals and thus between the electronic device and the second electronic device. Such contacts can also make permanent electrical connections with terminals or other input and/or outputs of a second electronic device. Some embodiments of the present invention are directed to carbon nanotube columns as electrical contacts and methods of making and using electrical contacts that comprise carbon nanotube columns.

SUMMARY

In some embodiments, an electronic device can include a substrate and electrically conductive contacts attached to the substrate. Each conductive contact can include a carbon-nanotube column of intertwined generally aligned carbon nanotube fibers. An elastic material can encapsulate at least partially each of the carbon-nanotube columns. The elastic material can impregnate at least some of the carbon-nanotube columns.

BRIEF DESCRIPTION OF THE DRAWINGS

FIGS. 3A and 3B illustrate an application substrate that can be used to apply an electrically conductive paste to ends of the contacts according to some embodiments of the invention.

FIGS. 9A and 9B illustrate an example of a response of the elastic material and a contact to a force on the contact according to some embodiments of the invention.

FIG. 11 illustrates an example of a probing device according to some embodiments of the invention.

FIG. 12 illustrates an example of an interposer according to some embodiments of the invention.

FIG. 14 illustrates making another interposer according to some embodiments of the invention.

FIGS. 15A-15E illustrate making yet another interposer according to some embodiments of the invention.

FIG. 16 illustrates an example of a test system according to some embodiments of the invention.

FIG. 17 illustrates an example of a test socket according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Some embodiments of the invention relate to electrical devices with carbon nanotube based contacts. The contacts can be electrically conductive, and can be utilized to make pressure-based electrical connections with electrical terminals or other contact structures of another device. In some embodiments, the contacts can comprise carbon nanotube columns and contact tips at ends of the columns. The contact tips can comprise a conductive paste applied to the ends of the columns and cured (e.g., hardened). The paste can be applied, cured, and/or otherwise treated to make the contact tips in desired shapes. In some embodiments, the carbon nanotube columns can be encapsulated in an elastic material that imparts the dominate spring characteristics desired of the contacts.

Figure 1:
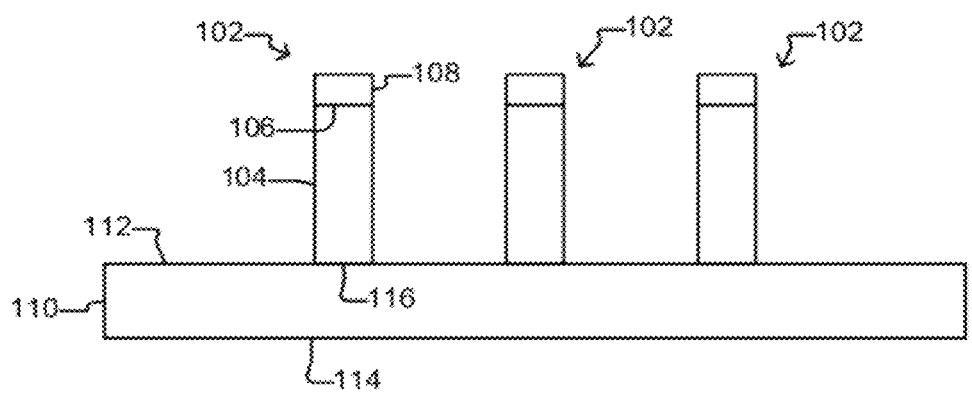
FIG. 1 illustrates electrically conductive contacts comprising carbon nanotube columns and contact tips according to some embodiments of the invention.

FIG. 1 illustrates a plurality of contact 102 (three are shown but there can be fewer or more) coupled to a substrate 110 according to some embodiments of the invention. Each contact 102 can comprise a column 104 of carbon nanotube fibers (hereinafter a "CNT column"). As also shown, each contact 102 can comprise a contact tip 108 disposed at an end 106 of the CNT column 104. The CNT columns 104 and contact tips 108—and thus the contacts 102—can be electrically conductive.

In some embodiments, each CNT column 104 can comprise a bundle of intertwined generally vertically aligned carbon nanotube fibers. The CNT columns 104 can include other materials. For example, the CNT columns 104 can include an electrically conductive material (e.g., a conductive metal such as gold, silver, or copper), which can be disposed generally on the outside of the CNT column 102 and/or inside the CNT column 102 (e.g., on carbon nanotube fibers inside the CNT column 102). Such materials can enhance, for example, the electrical conductivity of the CNT columns and can be applied to the CNT columns 102 by any technique suitable for applying such material. Examples of such techniques include atomic layer deposition, chemical layer deposition, chemical vapor deposition, sputtering, plating, and the like.

Each contact tip 108 can comprise a cured conductive paste, which can be formed in a desired shape. Thus, although contact tips 108 are illustrated in FIG. 1 as box shaped, the contact tips 108 can be other shapes. Examples of such shapes will be discussed below.

The contact tips 108 can be sufficiently hard to function as a structure that contacts an electrical terminal or other such contact structure on another electronic device for purposes of establishing a pressure-based electrical connection with the other device. A layer of material (not shown) can be added to the contact tip 108 to enhance electrical, mechanical, or cleaning characteristics of the tip 108. For example, a relatively thin (compared to the contact tip 108) layer of an electrically conductive material (not shown) such as an electrically conductive metal (e.g., gold, silver, or copper) can be applied to the contact tips 108, which can enhance the electrical conductivity of the tip 108. As another example, a mechanically hard material that is wear resistant can be applied to the contact tips 108, which can enhance the wearability of the tips 108. Whether to enhance electrical conductivity, mechanical wear, or both, such a layer of material (not shown) can be applied to the contact tips 108 in any suitable manner for applying such material such as sputtering, plating, atomic layer deposition, chemical vapor deposition, and the like. Moreover, if such material is applied to contact tips 108 by, for example, sputtering, the sputtering can be through a mask such as a shadow mask or the sputtering can be done without the use of a mask.

In addition to being a contact tip 108, each of the contact tips 108 can provide other advantages. For example, a contact tip 108 can mechanically tie the carbon nanotube fibers of a CNT column 104 together, which can enhance the mechanical strength and stability of the CNT column 104. As another example, a contact tip 108 can increase the electrical conductivity (and thus decrease the electrical resistance) of a CNT column 104.

The substrate 110 can be any structure suitable for supporting the contacts 102. In some embodiments, the substrate 110 can be a wiring substrate with electrical terminals (not shown) disposed on one or more surfaces (e.g., surfaces 112 and/or 114) and electrical connections (not shown) electrically connecting the terminals (not shown). In such embodiments, one or more of the CNT columns 104 can be coupled to such terminals (not shown) rather than the surface 112 of the substrate 110. Wiring substrates 1102 and 1202 in FIGS. 11 and 12 (which will be discussed below) are examples of such wiring substrates. Alternatively, substrate 110 can be a growth substrate on which the CNT columns 104 are grown or an intermediate or temporary substrate on which the CNT columns 104 are disposed.

The CNT columns 104 can be made in any suitable manner for making carbon nanotube columns. For example, as is known, carbon nanotube columns can be grown on a growth substrate, and CNT columns 104 in FIG. 1 can be grown on a growth substrate. Any technique for growing columns of bundled carbon nanotube fibers can be used to grow CNT columns 104 including fixed catalyst and floating catalyst techniques. Examples of suitable growth techniques are disclosed in US Published Patent Application No. 2009/0066352. In some embodiments, CNT columns 104 can be grown or subsequently treated to enhance or modify mechanical properties. For example, parameters relating to the process of growing CNT columns 104 can be modified to obtain desired mechanical properties.

CNT columns 104 can be grown on a growth substrate (not shown) and transferred from the growth substrate to substrate 110. The CNT columns 104 can be coupled to substrate 110 in any suitable manner including with a conductive joining material such as solder, a conductive nanopaste, a conductive epoxy, or the like. Alternatively, as mentioned above, substrate 110 can be a growth substrate, and CNT columns 104 can thus be grown on substrate 110.

Figure 2:
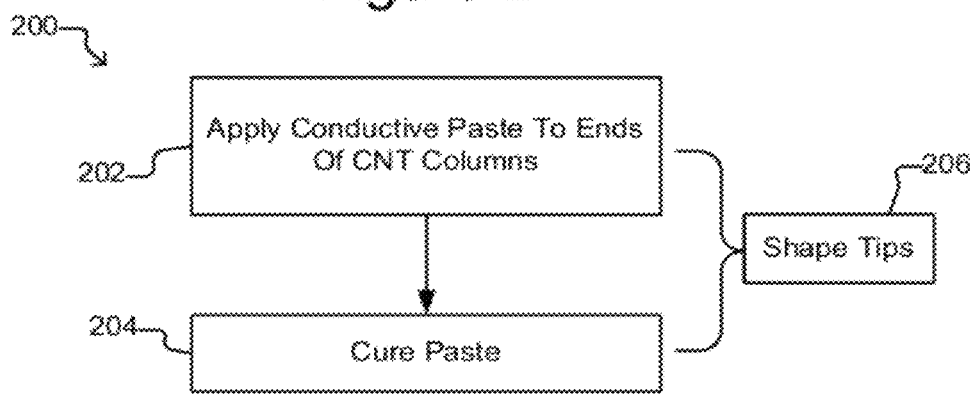
FIG. 2 illustrates a process for making contact tips according to some embodiments of the invention.

Process 200 of FIG. 2 illustrates an example of making contact tips 108 of contacts 102 of FIG. 1 according to some embodiments of the invention.

As shown in FIG. 2, at step 202, a layer of conductive paste can be applied to ends 106 of the CNT columns 104. The paste can be an electrically conductive material that is initially malleable but that hardens when cured. For example, the paste can be embedded with particles of a conductive material. In some embodiments, the paste can be an electrically conductive nanopaste. Examples of such nanopastes include nanopastes that comprise gold, silver, copper, palladium, and/or combinations (e.g., palladium-silver) or alloys of the foregoing. The paste can be applied at step 202 in an uncured state.

The paste can be applied at step 202 in any manner suitable for apply such paste to ends 106 of CNT columns 104. For example, the paste can be applied to ends 106 of the CNT columns 104 at step 202 with a brush, spatula, or similar instrument (not shown). As another example, the paste can be dispensed onto ends 106 of the CNT columns 104 through a dispenser (not shown).

FIGS. 3A and 3B illustrate yet another example of a technique for applying paste to ends 106 of the CNT columns 104. As shown in FIG. 3A, paste 306 to be applied to ends 106 of CNT columns 104 can be disposed in a cavity 308 in a surface 304 of an application substrate 302. The application substrate 302 can be any structure suitable for supporting paste 306 while the paste is being applied to ends 106 of CNT columns 104. For example, application substrate 302 can comprise glass, ceramic, or the like material. Cavity 308 can be etched or otherwise formed into application substrate 302. Cavity 308 can be sized and positioned as desired to correspond generally to the positions of ends 106 of at least some of columns 104. A depth D of cavity 308 from the surface 304 into the application substrate 302 can correspond to a desired thickness T of the paste 306 on ends 108 of the CNT columns 104 as shown in FIGS. 3A and 3B. Paste 306 can be deposited into cavity 308 in any suitable manner. For example, paste 306 can be deposited onto the surface 304 of the application substrate 302, and a wiping tool (not shown) can be moved across the surface 304 pressing paste 306 into the cavity 308 and wiping excess paste 306 off of the surface 304.

As generally illustrated in FIG. 3A, with paste 306 in cavity 308, application substrate 302 and/or substrate 110 can be moved so that paste 306 in cavity 308 is brought into contact with ends 106 of CNT columns 104. Then, as generally illustrated in FIG. 3B, application substrate 302 and substrate 110 can be moved apart (application substrate 302 and/or substrate 110 can actually be moved), leaving portions of paste 306 that were in contact with ends 106 of CNT columns 104 on the ends 106. As also shown in FIG. 3B, portions of paste 306 not in contact with ends 106 of CNT columns 104 can remain in the cavity 308. In some embodiments, surfaces of cavity 308 and/or ends 106 of CNT columns 104 can comprise material(s), be coated with material(s), or be otherwise treated so that paste 306 adheres more readily to ends 106 of columns 104 than to cavity 308.

Application substrate 302 illustrated in FIGS. 3A and 3B is an example only. For example, application substrate 302 need not include cavity 308. If application substrate 302 does not have cavity 308, a film of paste 306 can be applied to the surface 304 of application substrate 302. The film of paste 306 can have a thickness on surface 304 that corresponds to the desired thickness T of the paste 306 to be applied to ends 106 of CNT columns 104. Then, application substrate 302 and substrate 110 can be moved into contact and then moved apart (application substrate 302 and/or substrate 110 can actually be moved), leaving paste 308 on ends 106 of CNT columns 104 as generally shown in FIG. 3B. In some embodiments, the surface 304 of application substrate 302 and/or ends 106 of CNT columns 104 can comprise material(s), be coated with material(s), or be otherwise treated so that paste 306 adheres more readily to ends 106 of columns 104 than to the surface 304 of application substrate 302. As another example, cavity 308 can be replaced with multiple similar cavities (not shown) that are sized and positioned to correspond to ends 106 of CNT columns 104.

Regardless of how paste 306 is applied to ends 106 of CNT columns 104 at step 202 of FIG. 2, paste 306 applied to ends 106 of CNT columns 104 at step 202 can be cured (e.g., hardened) at step 204. Paste 306 can be cured at step 204 in any manner suitable for curing paste 306, which of course, may vary depending on the material composition of paste 306. For example, paste 306 can be cured at step 204 by heating paste 306, exposing paste 306 to a particular type of energy (e.g., light such as ultraviolet light or other types of radiated energy), or the like. Cured paste 306 on ends 106 of CNT columns 104 can be the contact tips 108 of FIG. 1.

As shown by step 206 in FIG. 2, one or more parameters relating to step 202 of applying paste 306 to ends 106 of columns 104 and/or step 204 of curing paste 306 can be selected, set, varied, changed, or manipulated to impart a desired shape to paste 306 and thus the resulting contact tips 108 in FIG. 1. For example, any of the following parameters can affect a shape of paste 306, and thus contact tips 108, on ends 106 of CNT columns 104: the thickness T of the paste 306 on the ends 106 of CNT columns; the viscosity and/or thixotropic properties of paste 306; the length of time paste 306, while in cavity 308 or on surface 304 of application substrate 302, is held in contact with ends 106 of CNT columns 104 (see discussions of FIGS. 3A and 3B above) during step 204; the force with which paste 306, while in cavity 308 or on surface 304 of application substrate 302, and ends 106 of CNT columns 104 (see discussions of FIGS. 3A and 3B above) are pressed together during step 202; the speed at which the application substrate 302 and/or substrate 110 are moved apart, which as discussed above, leaves paste 306 on ends 106 of CNT columns 104 during step 202; the length of time between depositing paste 306 in cavity 308 or on surface 304 of application substrate 302 and bringing the paste 306 into contact with ends 106 of CNT columns 104 at step 202; the length of time and temperature at which paste 306 is cured at step 204; and the cure loading (e.g., the initial temperature and the manner in which the temperature is changed during cure) of paste 306 during curing at step 204. A value or setting for any one or more of the foregoing parameters and/or other parameters of steps 202 and/or 204 can be set, varied, changed, or manipulated during step 202 and/or step 204 of FIG. 2 to impart a desired shape to paste 306 applied to ends 106 of CNT columns 104 and thus a resulting tip 108 at ends 106 of CNT columns 104. FIGS. 4A-7B illustrate examples of shapes that can be imparted to paste 306 on the ends 106 of CNT columns 104 and thus to contact tips 108 formed at the ends 106 of CNT columns 104. The examples of shapes illustrated in FIGS. 4A-7B are examples only, however, and the invention is not limited to contact tips 108 with those shapes.

Figure 4A:
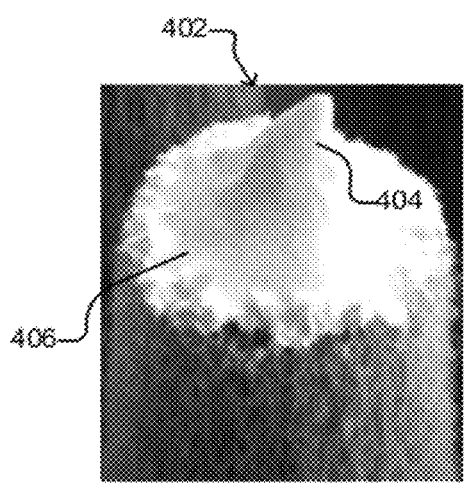
FIGS. 4A and 4B illustrate an example of a shape of the contact tips according to some embodiments of the invention.
Figure 4B:
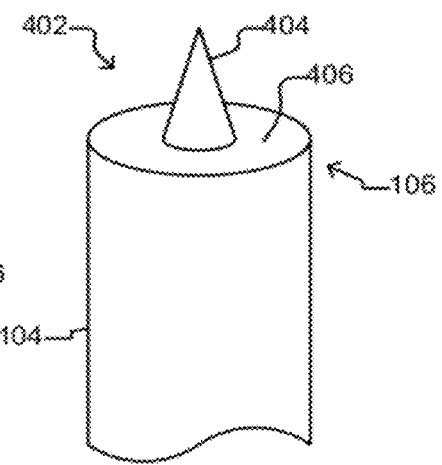

FIGS. 4A and 4B illustrate an example of a spear-shaped contact tip 402. (FIG. 4A is a photograph of a contact tip 402, and FIG. 4B is a drawing depiction of such a contact tip 402.) As shown, contact tip 402 comprises cured paste 406 at an end 106 of a CNT column 104 that includes a spear-like, pointed-cone structure 404 that extends away from the end 106 of the CNT column 104. The spear-shaped contact tip 402 can be formed by applying paste 306 to ends 106 of CNT columns 104 as shown in FIGS. 3A and 3B. The pointed-cone structure 404 can be formed in paste 306 applied to ends 106 of CNT columns 104 by rapidly moving application substrate 302 and/or substrate 102 apart. As noted above, the speed at which the application substrate 302 and/or substrate 102 are moved apart can affect the shape of the paste 306 that is transferred from the application substrate 302 to ends 106 of CNT columns 104. Generally speaking, the greater the speed the smaller the diameter and the longer the pointed-tone structure 404 will be.

Figure 5A:
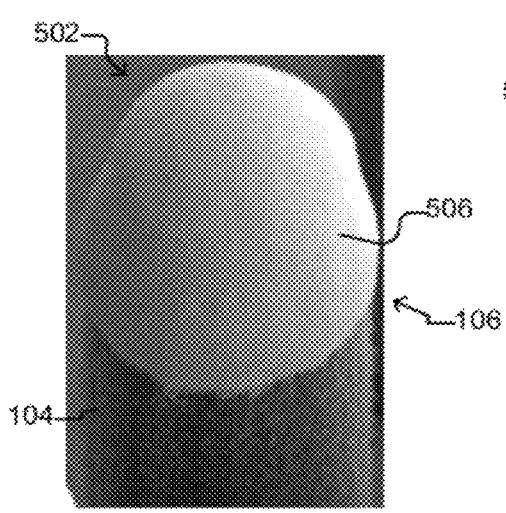
FIGS. 5A and 5B illustrate another example of a shape of the contact tips according to some embodiments of the invention.
Figure 5B:
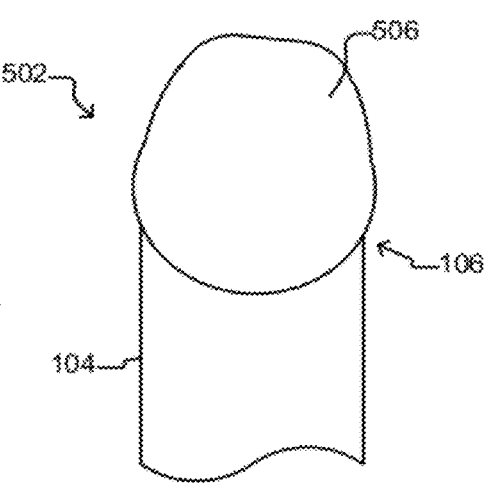

FIGS. 5A and 5B illustrate an example of a bullet-shaped contact tip 502. (FIG. 5A is a photograph of a contact tip 502, and FIG. 5B is a drawing depiction of such a contact tip 502.) As shown, contact tip 502 comprises cured paste 506 at an end 106 of a CNT column 104. As shown, cured paste 506 can have a generally rounded shape that tapers somewhat to a generally rounded upper end. The shape can be said to resemble the rounded end of a bullet. The bullet-shaped contact tip 502 can be formed by applying paste 306 to ends 106 of CNT columns 104 as shown in FIGS. 3A and 3B. The bullet shape can be formed in paste 306 applied to ends 106 of CNT columns 104 by slowly moving application substrate 302 and/or substrate 102 apart. As noted above, the speed at which the application substrate 302 and/or substrate 102 are moved apart can affect the shape of the paste 306 that is transferred from the application substrate 302 to ends 106 of CNT columns 104. Generally speaking, the slower the speed the less the taper of the shape toward the rounded upper end.

Figure 6A:
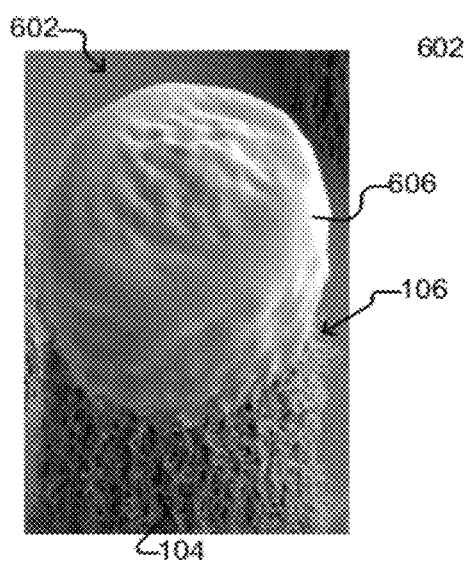
FIGS. 6A and 6B illustrate yet another example of a shape of the contact tips according to some embodiments of the invention.
Figure 6B:
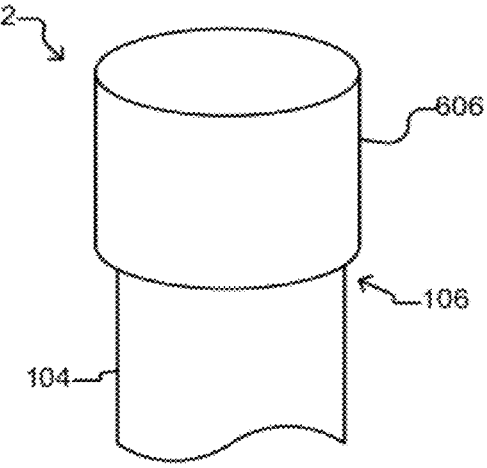

FIGS. 6A and 6B illustrate an example of a cap-shaped contact tip 602. (FIG. 6A is a photograph of a contact tip 602, and FIG. 6B is a drawing depiction of such a contact tip 602.) As shown, contact tip 602 comprises cured paste 606 at an end 106 of a CNT column 104. As shown, cured paste 606 can have a generally cap shape that covers end 106 of the CNT column 104. The cap-shaped contact tip 602 can be formed by applying paste 306 to ends 106 of CNT columns 104 as shown in FIGS. 3A and 3B. The cap shape can be formed in paste 306 applied to ends 106 of CNT columns 104 during the curing step 204 of FIG. 2 by hot-load curing the paste 306. Hot-load curing means that the curing of paste 306 starts with the cure temperature. For example, if paste 306 at ends 106 of CNT columns 104 is cured in a curing oven (not shown), the oven is heated to the curing temperature before the CNT columns 104 are placed into the curing oven. As noted above, the cure loading can affect the shape of the paste 306 on ends 106 of CNT columns 104.

Figure 7A:
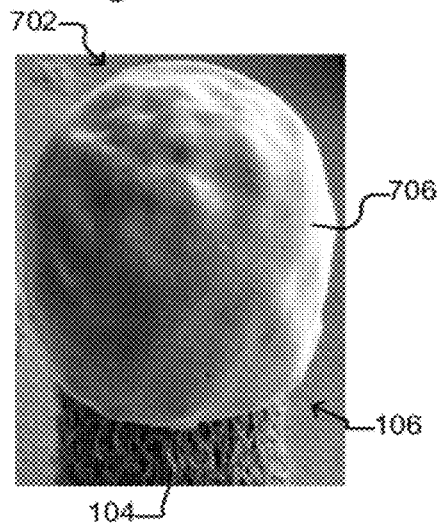
FIGS. 7A and 7B illustrate still another example of a shape of the contact tips according to some embodiments of the invention.
Figure 7B:
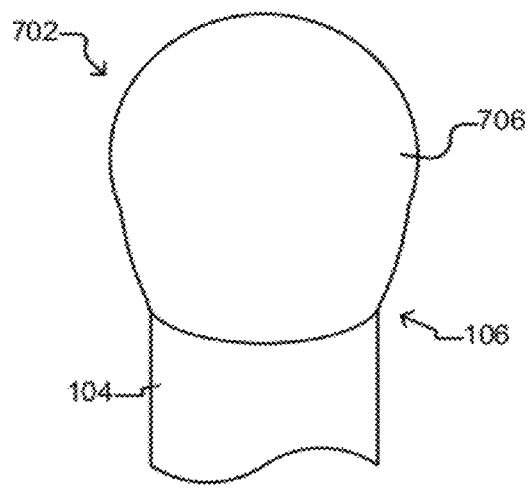

FIGS. 7A and 7B illustrate an example of a bulb-shaped contact tip 702. (FIG. 7A is a photograph of a contact tip 702, and FIG. 7B is a drawing depiction of such a contact tip 602.) As shown, contact tip 702 comprises cured paste 706 at end 106 of a CNT column 104. As shown, cured paste 706 can have a generally bulb shape that covers end 106 of the CNT column 104. That is, as shown, the bulb shape can flare out somewhat and then flare in along the length of the contact tip 702 from the bottom to the top (in FIGS. 7A and 7B). The bulb-shaped contact tip 702 can be formed by applying paste 306 to ends 106 of CNT columns 104 as shown in FIGS. 3A and 3B. The bulb shape can be formed in paste 306 applied to ends 106 of CNT columns 104 during the curing step 204 of FIG. 2 by cold-load curing the paste 306. Cold-load curing means that the curing of paste 306 starts at a temperature below the cure temperature and the temperature is thereafter raised to the curing temperature. For example, if paste 306 at ends 106 of CNT columns 104 is cured in a curing oven (not shown), the oven is at a temperature below the curing temperature (e.g., room temperature) when the CNT columns 104 are placed into the curing oven and thereafter the temperature in the oven is raised to the curing temperature. As noted above, the cure loading can affect the shape of the paste 306 on ends 106 of CNT columns 104.

As noted, contact tips 402, 502, 602, and 702 illustrate examples of shapes that contact tips 108 in FIG. 1 can take. Thus, contact tips 402, 502, 602, and/or 702 can replace contact tips 108 in any figure throughout this disclosure. It is noted, however, that the shapes illustrated in FIGS. 4A-7B are examples only. The shapes illustrated in FIGS. 4A-7B as well as variations of those shapes and many other shapes can be imparted to paste 306 applied to ends 106 of CNT columns 104 and the resulting contact tips 108 by selecting, setting, varying, changing, or manipulating parameters associated with steps 202 and 204 of FIG. 2 generally as discussed above.

As noted above, a layer of material (not shown) can be applied to the contact tips 108. As discussed above, such a layer can enhance the electrical and/or mechanical characteristics of the contact tips 108. Such a layer as well as other materials (not shown) can be applied to the contact tips 108.

Figure 8A:
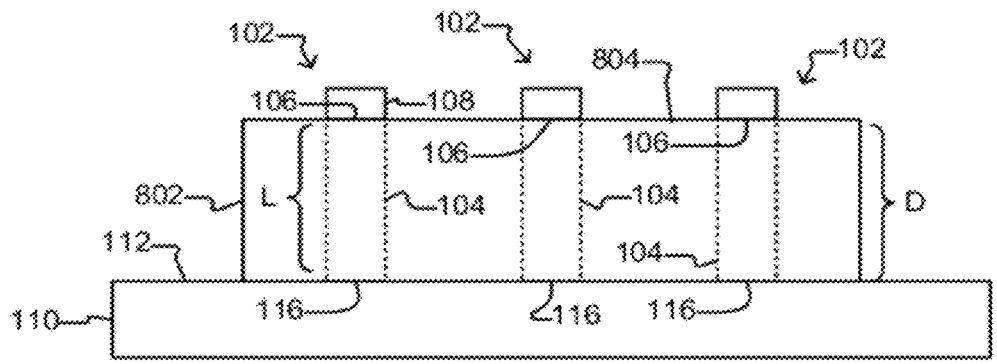
FIG. 8A illustrates contacts that are encapsulated in an elastic material according to some embodiments of the invention.
Figure 8B:
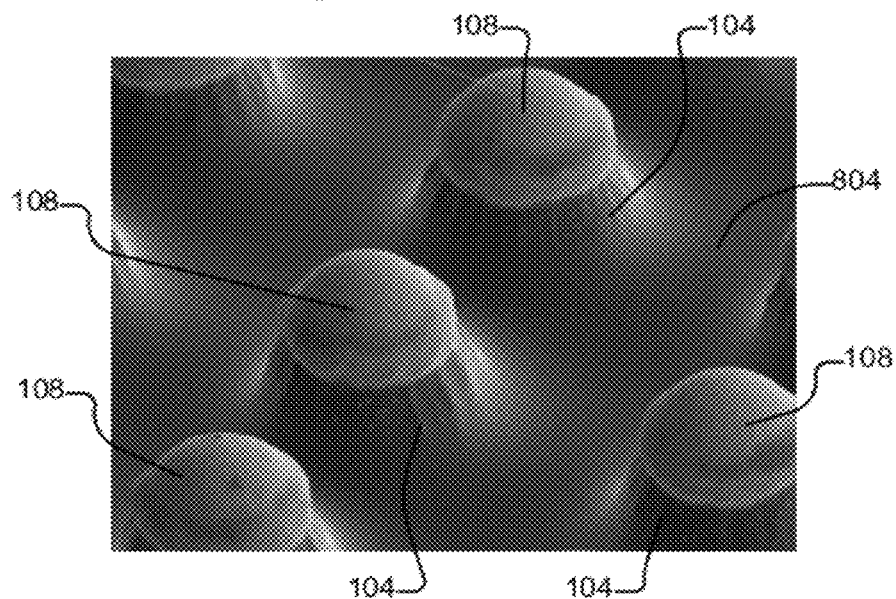
FIG. 8B is a picture of contacts that are partially encapsulated in an elastic material according to some embodiments of the invention.
Figure 10A:
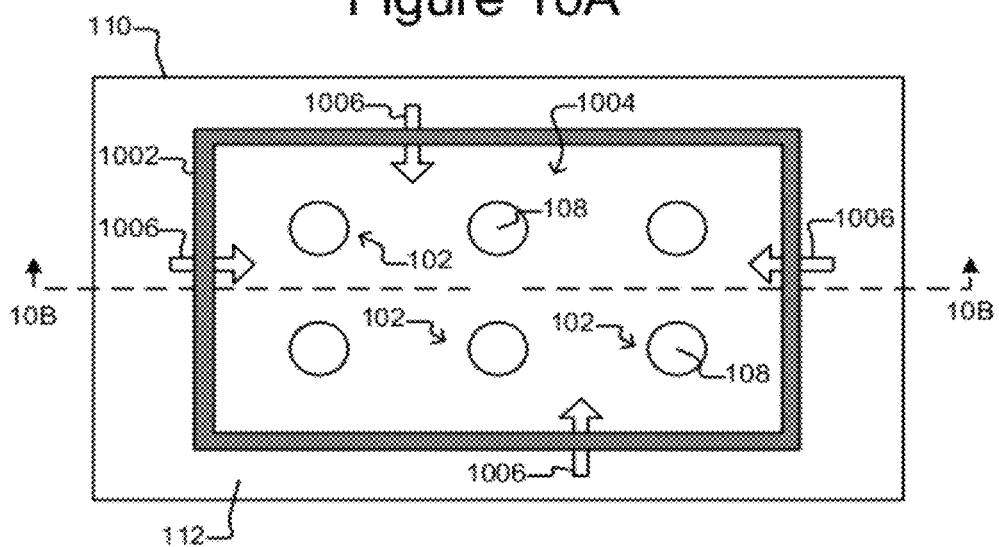
FIGS. 10A and 10B illustrate a process for encapsulating contacts in elastic material according to some embodiments of the invention.
Figure 10B:
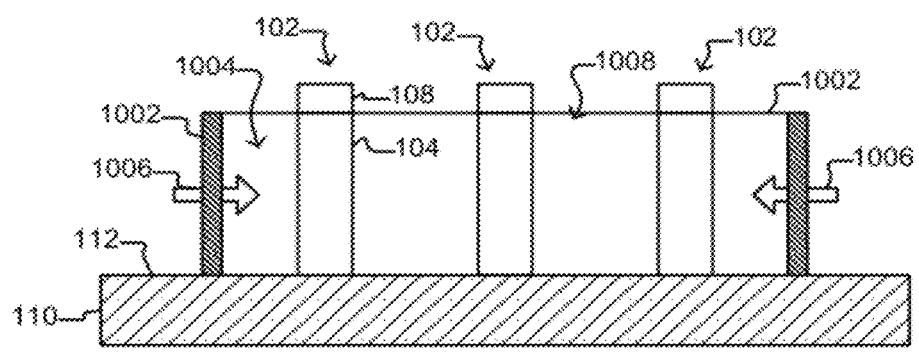

Thus far, contacts 102 comprising CNT columns 104 and contact tips 108 as well as examples of processes for making the contact tips 108 and examples of shapes the contact tips 108 can take have been illustrated and discussed. FIGS. 8A and 8B illustrate contacts 102 encapsulated in an elastic material 802, and FIGS. 10A and 10B illustrate an example of a technique for encapsulating contacts 102 in elastic material 802.

As shown in FIG. 8A, contacts 102 can be encapsulated in an elastic material 802. As used herein, a structure or material is "elastic" if application of a force (that is within the elastic range of the structure material) to the structure or material deforms, compresses, and/or stretches the structure or material, and then the structure or material returns to substantially its original shape, position, and/or location when the force is removed. Also as used herein, "fully," "completely," or "entirely" elastic means substantially or sufficiently elastic to work for the intended purpose. In other words, any deviation from ideal or perfect elasticity is negligible for the intended use or application.

The elastic material 802 can impregnate CNT columns 104. For example, elastic material 802 can penetrate and reside inside CNT columns 104. For example, elastic material 802 can be disposed on and/or between individual carbon nanotube fibers within a CNT column 104.

In FIG. 8A, L is the length of a CNT column 104 from end 116 to end 106, and D is the distance of the elastic material 802 from surface 112 of substrate 110 to an outer surface 804 of the elastic material 802. As shown in FIG. 8A, elastic material 802 can encapsulate entirely the CNT columns 104 of contacts 102, but can leave all or substantially all of contact tips 108 exposed. (CNT columns 104 are illustrated in dashed lines because the CNT columns 104 are inside elastic material 802.) That is, distance D can be approximately the same as length L. In other embodiments, however, elastic material 802 can encapsulate less than all of the CNT columns 104 of contacts 102, that is, distance D can be less than length L. For example, elastic material 802 can encapsulate at least 90% of each CNT column 104 (e.g., elastic material 802 can encapsulate 90% to 99%, including any percentage between 90% and 99% each CNT column 104). That is, in the foregoing examples, distance D can be 90% or more of length L (e.g., distance D can be 90% to 99%, including any percentage between 90% and 99% of length L). Thus, in such embodiments, 10% or less (for example) of the length L of each CNT column 104 from end 106 can extend from surface 804 out of the elastic material 802. In other embodiments, more than 10% of the length L of each CNT column 104 from end 106 can extend from surface 804. For example, in various embodiments, more than 10%, more than 20%, or more than 30% of the length L can extend from surface 804. FIG. 8B illustrates a picture of an embodiment in which elastic material 802 encapsulates less than the entire length L of each CNT column 104. As can be seen, distal end portions of CNT columns 104 can extend from the surface 804 of the elastic material 802.

In other embodiments, elastic material 802 can encapsulate not only the CNT columns 104 but at least part of contact tips 108. That is, in such examples, distance D shown in FIG. 8A can be greater than length L.

In still other embodiments, contacts 102 need not include contact tips 108 but can include other contact tip structures coupled to ends 106 of CNT columns 104 in place of contact tips 108. Alternatively, contacts 102 need not include any type of contact tip structure at ends 106 of CNT columns 104. That is, each contact 102 can comprise a CNT column 104 without a contact structure (e.g., like 108) at end 106, in which case end 106 can function as a contact tip of the contact 102. In such a case, a portion of each CNT column 104 can extend out of surface 804 of elastic material 802. As noted above, for example, 10% or less of the length L of a CNT column 104 from end 106 can extend out of elastic material 802. In other examples, 1% to 10% (including any percentage between 1% and 10%) of the length L of a CNT column 104 from end 106 can extend out of surface 804 of elastic material 802.

Some or all of the mechanical characteristics of contacts 102 can be substantially the mechanical characteristics of elastic material 802. In other words, mechanical characteristics of elastic material 802 can dominate mechanical characteristics of contacts 102 such that the effective mechanical characteristics of contacts 102 are, in essence, the mechanical characteristics of elastic material 802. For example, mechanical characteristics corresponding to the response of a contact 102 to a force on contact tip 108 (e.g., such as would arise when contact tip 108 is pressed against a terminal of an electric device) can be substantially the mechanical characteristics of elastic material 802. For example, the spring constant, elastic range, and other such mechanical parameters of contacts 102 can be substantially the same as the spring constant, elastic range, etc. of elastic material 802.

For example, the CNT column 104 portion of each contact 102 may not be sufficiently strong by itself for the contact 102 to function as an electrical probe. For example, CNT columns 104 grown using a fixed catalyst process may be too weak (i.e., not sufficiently strong) to function by themselves as part of electrical probes. Elastic material 802 can provide the needed mechanical strength so that such contacts 102, even if insufficiently strong on their own, are sufficiently strong when embedded in elastic material 802.

As another example, contacts 102 by themselves need not be elastic. That is, by themselves (e.g., standing alone without elastic material 802), contacts 102 may not be elastic or may not be fully elastic. For example, a force applied to a contact tip 108 generally in the direction of substrate 110 can compress the CNT column 104, and the CNT column 104 may not fully recover its original shape and/or position after the force is removed. The elastic material 802, however, can impart full elasticity to CNT columns 104 and thus to contacts 102. That is, even if the CNT columns 104 by themselves are not fully elastic, the CNT columns 104 can function as fully elastic due to the encapsulating elastic material 802. FIGS. 9A and 9B illustrate an example.

In FIGS. 9A and 9B, a terminal 904 of an electronic device 902 is pressed against a contact tip 108 of a contact 102 as shown in FIG. 9A. As shown in FIG. 9B, the electronic device 902 can be moved past the location 906 of first contact between the terminal 904 and the contact tip 108 by an over travel distance $D_{OT}$. The resulting force on the contact tip 108 can compress both the elastic material 802 and the CNT column 104 as illustrated in FIG. 9B. In FIG. 9B, compressed length $L_C$ can be the length of CNT column 104 from end 116 to end 106 when the CNT column is compressed. The CNT column 104, contact tip 108, and terminal 904 can be electrically conductive, and the pressing of terminal 904 against contact tip 108 as shown in FIG. 9B can establish a temporary, pressure-based electrical connection between the contact 102 and the terminal 904.

The electronic device 902 can be removed. The elasticity of elastic material 802 can cause elastic material 802 to return substantially to its original shape and/or position shown in FIG. 9A prior to contact between terminal 904 and contact tip 108. Because CNT column 104 is embedded in the elastic material 802, the elastic material 802 can also cause the CNT column 104 to return to its original shape and/or position shown in FIG. 9A even if CNT column 104 by itself is not fully elastic. This can provide advantages. For example, the CNT column 104—and thus the contact 102—can be optimized for electrical characteristics, and the elastic material 802 can be optimized for mechanical (e.g., spring characteristics).

Moreover, elastic material 802 can be selected and/or configured to provide desired mechanical properties to CNT columns 104 and thus contacts 102. For example, elastic material 802 can be selected to provide a desired amount or range of over travel distance $D_{OT}$—and thus compressed length $L_C$—that can be achieved with effective full elasticity of CNT columns 104. For example, elastic material 802 can be selected to allow a CNT column 104 to be compressed to a compression length $L_C$ of at least 75% of the length L of an uncompressed CNT column 104. In other embodiments, the elastic material 802 can be selected to allow a CNT column 104 to compress to a compressed length $L_C$ of 60%, 50%, 40%, 30%, or less of the length L of an uncompressed CNT column 104. For example, the elastic material 802 can be selected to allow a CNT column 104 to compress to a compressed length $L_C$ of up to 30% of the length L of an uncompressed CNT column 104. Consistent with the foregoing examples, the elastic material 802 can be selected such that the over travel distance $D_{OT}$ can be 25%, 40%, 50%, 60%, 70%, or greater of the length L of an uncompressed CNT column 104. The foregoing numerical values and ranges are examples only, and the invention is not so limited.

The elastic material 802 can comprise any materials that impart the desired mechanical properties to contacts 102. For example, characteristics and parameters such as the chemical composition, processing, and/or curing of elastic material 802 can be selected to impart desired mechanical properties to contacts 102. In some embodiments, elastic material 802 can be configured to have a modulus of elasticity between 0.001 to 4.000 gigapascals, although the invention is not so limited. In some embodiments, elastic material 802 can be a material that can be deposited onto substrate 110 and around contacts 102 in a flowable state and then cured into a non-flowable state. Examples of suitable materials for elastic material 802 can include elastomer materials such as silicon or polymer based elastomer material or a rubberized epoxy based material. Other examples of suitable materials for elastic material 802 include silicone elastomer materials. Thus, elastic material 802 can comprise a silicone elastomer material. An example of such a silicone elastomer material is a material available from Dow Corning and sold under the product name "93-500 space-grade encapsulate."

In some embodiments, elastic material 802 can comprise an elastomer composition that comprises an epoxy, a flexibilizer, an epoxy curative, and a solvent. In some embodiments, the optimum weight ratio of the epoxy to flexibilizer to epoxy curative to solvent can be as follows: about ten times the epoxy, about twenty times the flexibilizer, about three times the epoxy curative, and about six times the solvent. The foregoing is an example only, and other weight ratios can be used.

Regardless of the weight ratios, the examples of the epoxy, flexibilizer, epoxy curative, and solvent can be as follows.

The epoxy can have the following general formula:

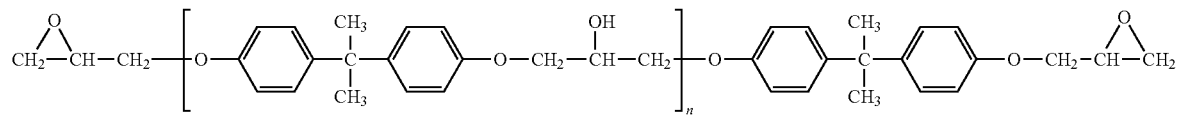

For example, a suitable epoxy is available from Dow Chemical company under the name DER 383.

The flexibilizer can comprise a polypropylenglycol block and diamine terminating units. The flexibilizer can have the following general formula:

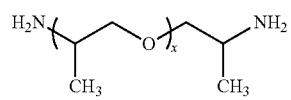

For example, a suitable flexibilizer is available from Huntsman Chemical company under the name Jeffamine D2000 (X=3).

In some embodiments, the epoxy curative can be 2-ethyl-4-methyl-1H-imidazole-1-propanitrile (n=2, X=CN), which can have the following formula

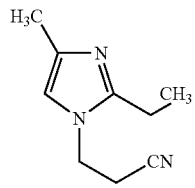

In some embodiments, the epoxy curative can have the following general formula:

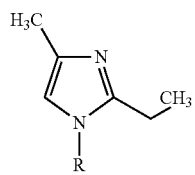

where R is alkyl of CnH2n+1, with n=0 to 30 or substituted alkyl of CnH2nX, with n from 0 to 30 and X being CN or NO2.

The solvent can have a boiling point between 40 and 250 degrees Celsius. For example, the solvent can comprise anisole.

An elastic material 802 comprising epoxy, a flexibilizer, an epoxy curative, and a solvent as discussed above is but an example, and elastic material 802 can comprise fewer materials, additional materials, and/or different materials. For example, in addition to epoxy, a flexibilizer, an epoxy curative, and a solvent, elastic material 802 can also comprise a rubber material, which can be a synthetic or natural rubber.

Regardless of the composition of elastic material 802, elastic material 802 can be formed or deposited onto substrate 110 and around contacts 102 in any manner suitable for forming or depositing such materials on a substrate. FIGS. 10A and 10B illustrate an example of a suitable process for forming elastic material 802.

As shown in FIGS. 10A and 10B, a dam 1002 can be provided on the surface 112 of substrate 110. Dam 1002 can enclose a space 1004 that includes contacts 102. Elastic material 802 in a flowable state can then be deposited into the space 1004 enclosed by dam 1002. For example, elastic material 802 (in a flowable state) can be deposited through inlets 1006 (e.g., inlet ports) in the side walls of dam 1002. Alternatively, elastic material 802 (in a flowable state) can be deposited through an upper opening 1008 in Dam 1002. As yet another alternative, elastic material 802 (in a flowable state) can be deposited through inlets 1006 and upper opening 1008. Any type of dispenser (not shown) can be used to deposit the elastic material 802 (in a flowable state). In some embodiments, a distance between contacts 102 can be forty microns or smaller, although in other embodiments, a distance between contacts 102 can be greater than forty microns.

After elastic material 802 is deposited into the space 1004 within dam 1002, elastic material 802 can be cured to change elastic material from a flowable state to a cured (e.g., hardened) state. Elastic material 802 can be cured in any manner suitable for curing the particular type of material selected for elastic material 802. For example, elastic material 802 can be cured by heating elastic material 802, exposing elastic material 802 to a particular type of energy (e.g., light such as ultraviolet light or other types of radiated energy), or the like. Once elastic material 802 is cured, dam 1002 can be removed. If needed or desired, any residue of elastic material 802 on contact tips 108 can be removed. Alternatively, any such residue of elastic material 802 can be left on contact tips 108. For example, such residue can, in some examples, break or wear off of contact tips 108 as contact tips 108 are later used.

Dam 1002 can be any structure suitable for acting as a mold for elastic material 802 in a flowable state. For example, dam 1002 can comprise relatively rigid side walls. As another example, dam 1002 can comprise CNT columns (which can be similar to CNT columns 104) coupled to surface 112 of substrate 110 and spaced sufficiently close together to hold elastic material 802 within enclosed space 1004 while elastic material 802 is in a flowable state.

There are many possible uses and applications for electrically conductive contact structures like contact structures 102 embedded in an elastic material like elastic material 802. One example of such a use or application is electrical probing, and another example is as part of an electrical interpose. FIGS. 11 and 12 illustrate examples.

FIG. 11 illustrates an example of a probing device 1100. Probing device 1100 can be essentially the same as the product illustrated in FIG. 8A except that the general substrate 110 in FIG. 8A is replaced with a wiring substrate 1102, and ends 116 of CNT columns 104 are coupled to electrically conductive terminals 1104 of wiring substrate 1102. (As noted above, substrate 110 of FIG. 8A can be any of many different types of substrates including a wiring substrate.) Otherwise, with wiring substrate 1102 replacing substrate 110, contacts 102 (including CNT columns 104 and contact tips 108) and elastic material 802 can be the same as, can have the same characteristics and properties, and can be made and used in the same way as contacts 102 and elastomeric material 802 are described anywhere above including all variations and modifications described above. For example, contacts 102 can have contact tips that are different than contact tips 108, or contacts 102 need not have any contact tips.

As shown in FIG. 11, wiring substrate 1102 can comprise electrically conductive terminals 1104 disposed on one surface 1108 and electrically conductive terminals 1106 disposed on an opposite surface 1110. Although terminals 1104 are shown in FIG. 11 spaced a different distance apart than terminals 1106, terminals 1104 can be spaced the same distance apart as terminals 1106. Regardless, electrical connections (e.g., electrically conductive traces and/or vias) (not shown) on and/or in wiring substrate 1102 can electrical connect terminals 1104 and terminals 1106. Contacts 102 can thus be electrically connected to terminals 1106.

As shown, ends 116 of CNT columns 104 can be coupled to terminals 1104, and elastic material 802 can be disposed on surface 1108 of wiring substrate 1102 and can encapsulate contacts 102. Ends 116 of CNT columns 104 can be coupled to terminals 1104 in any suitable manner including with electrically conductive joining material such as solder, conductive epoxy, conductive nanopaste, or the like. Terminals 1104 are shown in dashed lines because the terminals 1104 can be inside elastic material 802.

Probing device 1100 can be made as follows. CNT columns 104 can be grown on a growth substrate (not shown), and CNT columns 104 can be electrically enhanced such as be depositing electrically conductive material on and or inside the CNT columns 104 as discussed above. CNT columns 104 can then be transferred to wiring substrate 1102 and released from the growth substrate (not shown). Ends 116 of CNT columns 116 can be coupled to terminals 1104 of wiring substrate 1102 in any suitable manner including with solder or an electrically conductive adhesive such as a conductive epoxy or nanopaste. Terminals 1104 on the wiring substrate 1102 can have a wide range of pitches (distance between adjacent terminals 1104) including, for example, 1.25 millimeters to 20 microns. Contact tips 102 can be formed on ends 106 of CNT columns 104, for example, as shown in FIG. 2 above, and the CNT columns 104 can be embedded in elastic material 802, for example, as shown in FIGS. 10A and 10B above.

FIG. 12 illustrates an example of an interposer 1200. As shown, interposer 1200 can comprise a wiring substrate 1202 with electrically conductive terminals 1204 on one surface 1208 and electrically conductive terminals 1206 on an opposite surface 1210. Electrical connections (e.g., electrically conductive traces and/or vias) (not shown) on and/or in wiring substrate 1202 can electrical connect terminals 1204 and terminals 1206. Terminals 1204 and 1206 are shown in dashed lines because the terminals 1204 and 1206 can be inside elastic material 802.

As shown, contacts 102 encapsulated in elastic material 802 can be disposed on terminals 1204 and surface 1208. For example, ends 116 of CNT columns 104 can be coupled (e.g., with an electrically conductive joining material such as solder, conductive epoxy, or the like) to terminals 1204, and elastic material 802 can be disposed on surface 1208 of wiring substrate 1202. With wiring substrate 1202 replacing substrate 110, contacts 102 (including CNT columns 104 and contact tips 108) and elastic material 802 can be the same as, have the same characteristics and properties, and be made and used in the same way as contacts 102 and elastomeric material 802 are described anywhere above including all variations and modifications described above. For example, contacts 102 can have contact tips that are different than contact tips 108, or contacts 102 need not have any contact tips.

As also shown in FIG. 12, interposer 1200 can comprise contacts 102' encapsulated in elastic material 802'. The contacts 102' can be disposed on terminals 1206, and elastic material 802' can be disposed on surface 1210. Contacts 102' can be the same as contacts 102 and can comprise CNT columns 104' that are the same as CNT columns 104 and contact tips 108' that are the same as contact tips 108. Ends 116' of CNT columns 104' can be coupled (e.g., with an electrically conductive joining material such as solder, conductive epoxy, or the like) to terminals 1206, and elastic material 802' can be disposed on surface 121o of wiring substrate 1202. With wiring substrate 1202 replacing substrate 110, contacts 102' (including CNT columns 104' and contact tips 108') and elastic material 802' can be the same as, have the same characteristics and properties, and be made and used in the same way as contacts 102 and elastomeric material 802 are described anywhere above including all variations and modifications described above. For example, contacts 102' can have contact tips that are different than contact tips 108', or contacts 102' need not have any contact tips.

As noted above, terminals 1204 can be electrically connected to terminals 1206. Consequently, electrically conductive contacts 102 can be electrically connected to electrically conductive contacts 102'.

Figure 13A:
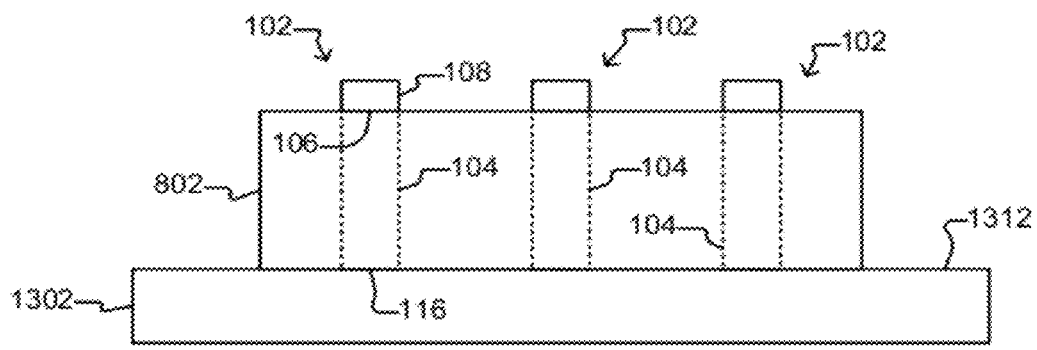
FIGS. 13A and 13B illustrate making an interposer according to some embodiments of the invention.
Figure 13B:
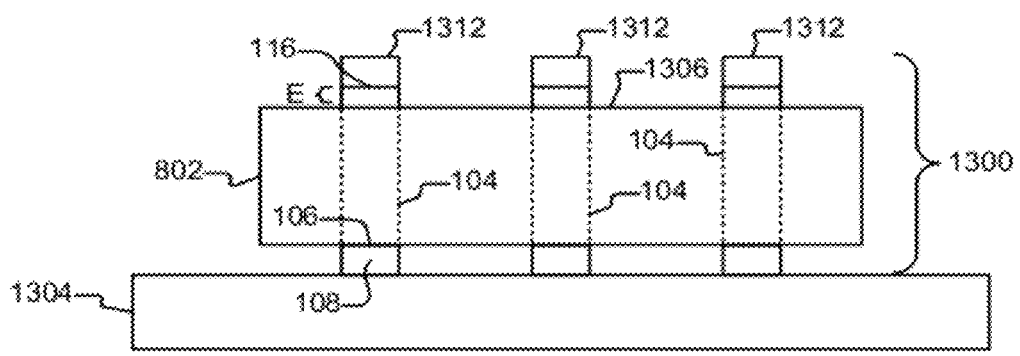

Examples of processes for making contact tips 108 with conductive paste and encapsulating contacts 102 in an elastic material 802 and corresponding uses and applications have been illustrated in and discussed above with respect to FIGS. 1 through 12. The foregoing are examples only, and variations and modifications are possible. FIGS. 13A, 13B, and 14 illustrate examples of alternative processes and products.

FIGS. 13A and 13B illustrate a process for making an interposer according to some embodiments of the invention. In FIGS. 13A and 13B elements that are the same as elements in other figures are like numbered. Thus, for example, CNT columns 104, contact tips 108, and elastic material 802 are the same as and can have the same features, variations, enhancements, etc. as like numbered and named elements in any other figure.

Referring to FIG. 13A, CNT columns 104 can be grown on a growth substrate 1302. Growth substrate 1302 can be any substrate suitably prepared for growing columns of bundled carbon nanotubes, and CNT columns 104 can be grown as generally discussed above. Contact tips 108 can be formed on ends 106 of CNT columns 104 as discussed above with respected to, for example, FIG. 2. Contacts 102 can be encapsulated in elastic material 802 as discussed above with respect to, for examples, FIGS. 10A and 10B. The result can be contacts 102 encapsulated in elastic material 802 on a surface 1312 of growth substrate 1302 as shown in FIG. 13A, which can be the same as the product shown in FIG. 8A with substrate 110 of FIG. 8A replaced with growth substrate 1302. (As noted above, substrate 110 can be a growth substrate on which CNT columns 104 are grown.)

Referring now to FIG. 13B, contacts 102 and elastic material 802 can be transferred from growth substrate 1302 to an intermediate substrate 1304. For example, contact tips 108 can be temporarily coupled to intermediate substrate 1304, and then ends 116 of CNT columns 104 can be released from growth substrate 1302. Contact tips 108 can be coupled to intermediate substrate 1304 using any suitable coupling technique such as a relatively weak adhesive material (not shown) or the like. Ends 116 of CNT columns 104 can be separated from growth substrate 1302 using any suitable technique including any of well known techniques for separating CNT columns from a substrate on which the columns were grown. Elastic material 802 can be released from growth substrate 1302 using any suitable technique including etching away a portion E of the elastic material 802 as shown in FIG. 13B.

As also shown in FIG. 13B, contact tips 1312 can be formed on ends 116 of CNT columns 104. Contact tips 1312 can be like and can be made in the same way as contact tips 108. For example, contact tips 1312 can comprise a cured electrically conductive paste and can be made using process 200 of FIG. 2 including any variation discussed above with respect to FIGS. 2 and 3A through 7B. Thus, contact tips 1312 can have, for example, any of the shapes illustrated in FIGS. 4A through 7B.

Contact tips 108 can then be released from intermediate substrate 1304. The resulting product can be an interposer 1300 (see FIG. 13B) in which CNT columns 104 are embedded in elastic material 802. Contact tips 108 can be coupled to ends 106 of CNT columns 104, and contact tips 1312 can be coupled to ends 1312 of CNT columns 104.

FIGS. 13A and 14 illustrate an alternative process for making an interposer 1400. Referring to FIG. 14, product 1402 comprising CNT columns 104 encapsulated in elastic material 802 with contact tips 108 coupled to ends 106 of CNT columns 104 can be made on growth substrate 1302 as illustrated in FIG. 13A and discussed above with respect to FIG. 13A. Product 1402 can then be released from growth substrate 1302.

Product 1402' can then be made on growth substrate 1302 (or a different but similar growth substrate) and then released from growth substrate 1302. Product 1402' can be generally the same as product 1402. For example, product 1402' can comprise CNT columns 104' (which can be like and can be made in the same way as CNT columns 104) encapsulated in elastic material 802' (which can be like and can be made in the same way as elastic material 802) with contact tips 108' (which can be like and can be made in the same way as contact tips 108) coupled to ends 106' of CNT columns 104' (which can be the same as CNT columns 104).

As shown in FIG. 14, product 1402 and product 1402' can then be coupled to each other such that ends 116 of CNT columns 104 of product 1402 are coupled to ends 116' of CNT columns 104' of product 1402'. Products 1402 and 1402' can be coupled using any suitable coupling technique including joining material such as adhesives or the like. Ends 116 and 116' can be coupled such that an end 116 is electrically coupled to an end 116'. In this way, contact tips 108 can be electrically connected to contact tips 108'.

In an alternative process to that discussed above with respect to FIGS. 13A and 14, product 1402 need not be used with a second similar product 1402'. For example, product 1402 can be joined to a wiring substrate such as wiring substrate 1102 in FIG. 11. In such a case, ends 116 of CNT columns 104 (of product 1402) can be electrically coupled (e.g., with an electrically conductive joining material (not shown) such as solder, electrically conductive epoxy, or the like) to terminals 1104 of wiring substrate 1102 of FIG. 11, and elastic material 802 (of product 1402) can be coupled (e.g., with an adhesive such as a non-conductive epoxy or the like) to surface 1108 of wiring substrate 1102 to produce product 1100 of FIG. 11. Product 1200 of FIG. 12 can similarly be produced by joining products 1402 and 1402' to wiring substrate 1202 in place of the contacts 102 and elastic material 802 and contacts 102' and elastic material 802' shown in FIG. 12.

FIGS. 15A-15E illustrate yet another process for making an interposer according to some embodiments of the invention. As will be seen, FIGS. 15A-15E can be a variation of the process illustrated in FIGS. 13A and 13B. In FIGS. 15A-15E elements that are the same as elements in FIGS. 13A and 13B are like numbered. Thus, for example, CNT columns 104, contact tips 108, growth substrate 1302, intermediate substrate 1304, and contact tips 1312 in FIGS. 15A-15E are the same as and can have the same features, variations, enhancements, etc. as like numbered and named elements in FIGS. 13A and 13B or any other figure herein.

Figure 15A:
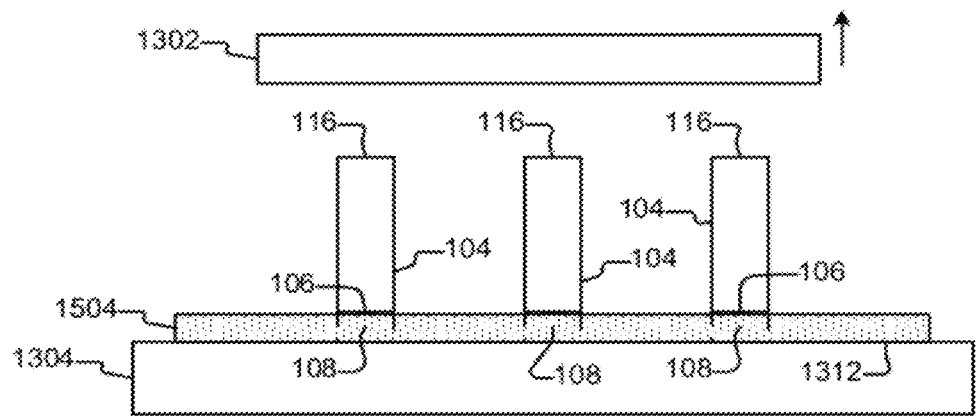

As shown in FIG. 15A, CNT columns 104 can be transferred from growth substrate 1302 to an intermediate substrate 1304. (As discussed above with respect to FIG. 13A, CNT columns 104 can be grown on growth substrate 1302, and contact tips 108 can be formed on ends 106 of CNT columns 104.) As also discussed above with respect to FIGS. 13A and 13B, the contact tips 108 can be temporarily coupled to intermediate substrate 1304, and the ends 116 of CNT columns 104 can then be released from growth substrate 1302. Contact tips 108 can be coupled to intermediate substrate 1304 using any suitable coupling technique such as a relatively weak adhesive material 1504 or the like. Ends 116 of CNT columns 104 can be separated from growth substrate 1302 using any suitable technique including any of well known techniques for separating CNT columns from a substrate on which the columns were grown.

Figure 15B:
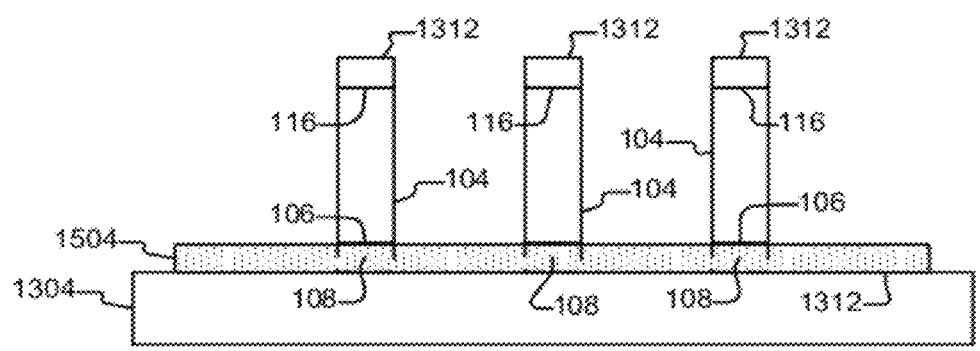

As shown in FIG. 15B and as generally discussed above with respect to FIG. 13B, contact tips 1312 can be formed on ends 116 of CNT columns 104. As discussed above, contact tips 1312 can be like and can be made in the same way as contact tips 108. For example, contact tips 1312 can comprise a cured electrically conductive paste and can be made using process 200 of FIG. 2 including any variation discussed above with respect to FIGS. 2 and 3A through 7B. Thus, contact tips 1312 can have, for example, any of the shapes illustrated in FIGS. 4A through 7B. As another example, as discussed above with respect to contact tips 108, contact tips 1312 can include other materials such as one or more materials deposited on the contact tips 1312 to enhance electrical conductivity or wear.

Figure 15C:
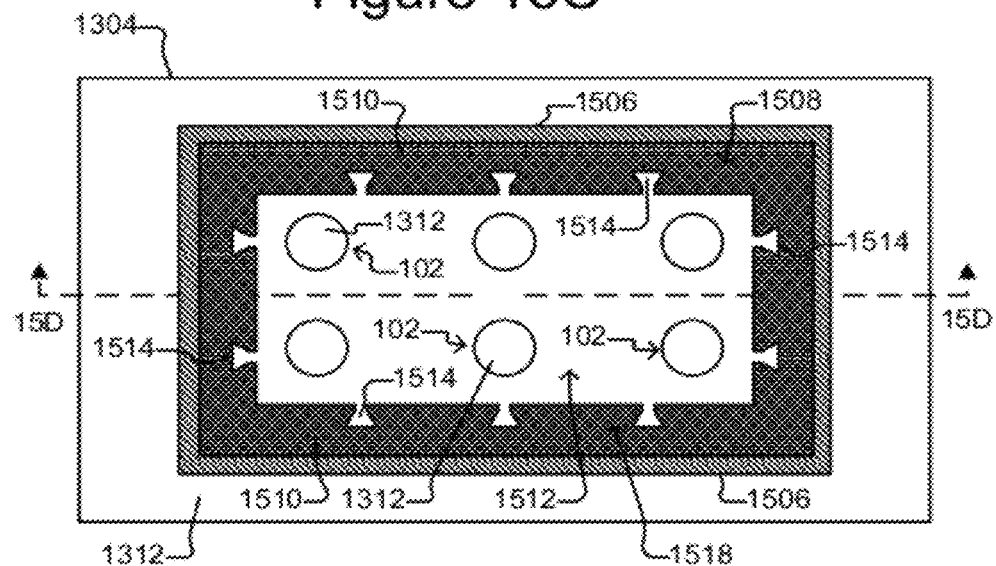
Figure 15D:
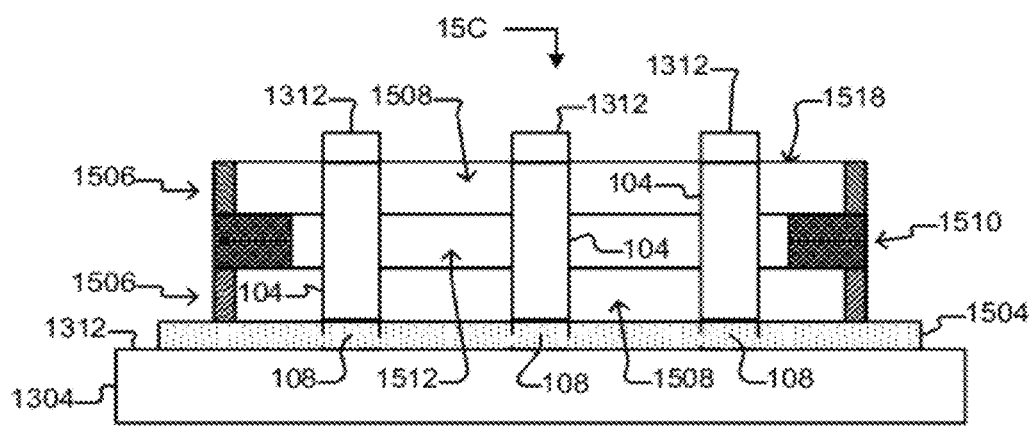

As shown in FIGS. 15C and 15D (FIG. 15C shows a top view, and FIG. 15D shows a cross-sectional, side view), dams 1506 and a frame 1510 each with interior enclosed spaces 1508 and 1512 can be disposed on adhesive 1504 and enclosing CNT columns 104. As will be seen, dams 1506 can be temporary structures and frame 1510 can be a permanent structure intended to be a part of the final interposer 1500 (see FIG. 15E). Dams 1506 can be like dam 1002, and frame 1510 can be a relatively rigid structure that can be used to handle and/or mount or attach interposer 1500 (see FIG. 15E) to another device or structure. Although two dams 1506 and one frame 1510 are shown in FIGS. 15C and 15D, there can be more frames 1510 and more or fewer dams 1506.

Dams 1506 and frames 1510 can be stacked generally as illustrated in FIGS. 15C and 15D so that the enclosed spaces 1508 and 1512 of the dams 1506 and frame 1510 form a mold 1518 around the CNT columns 104. The shape of the mold 1518 can be negative of the desired shape of elastic material 1516 that is to be formed around CNT columns 104 (see FIG. 15E). As shown, frame 1508 can include cavities 1514, which when filed with elastic material 1516, can interlock the elastic material 1516 with the frame 1508.

Regardless of the shape of mold 1518, elastic material 1516 in a flowable state can then be deposited into the mold 1518. Elastic material 1516 can be like elastic material 802 as described herein including any variations and modifications. Elastic material 1516 (in a flowable state) can be deposited into mold 1518 in any suitable manner including with any suitable dispenser (not shown) and through a top opening of the mold 1518 and/or through inlet (not shown) in dams 1506 and/or frame 1510. Such inlets (not shown) can be similar to inlets 1006 in FIGS. 10A and 10B.

After elastic material 1518 is deposited into the mold 1518, elastic material 1518 can be cured to change elastic material 1518 from a flowable state to a cured (e.g., hardened) state. As stated above, elastic material 1518 can be like or the same as elastic material 802 and can thus be cured in any of the ways discussed above for curing elastic material 802.

Once elastic material 1518 is cured, contact tips 108 can be released from temporary substrate 1304. The resulting product can be interposer 1500 as shown in FIG. 15E. As shown, interposer 1500 can comprise CNT columns 104 embedded in elastic material 1516 and with contact tips 108 and 1312 on respective ends 106 and 116 of the CNT columns 104. (CNT columns 104 are shown in dashed lines because the CNT columns 104 are inside the elastic material 1516.) As also shown, frame 1510 can encompass the elastic material 1516. CNT columns 104 can be but need not be completely embedded in elastic material 1516. Similarly, elastic material 1516 can embed portions of contact tips 1312 and/or 108. Regardless, some embodiments of interposer 1500 can provide advantages including cost saving (e.g., interposer 1500 need not include a wiring substrate) and electrical performance (e.g., there need not be vias, traces, or the like between contact tips 108 and 1312).

As noted above, there are many possible uses and applications for electrically conductive contact structures like contact structures 102 embedded in an elastic material like elastic material 802. Such uses include a probing device such as the example of a probing device 1100 of FIG. 11 and an interpose such as the examples of interposers 1200, 1300, 1400, and 1500 shown in FIGS. 12, 13, 14, and 15E. FIG. 16 illustrates an example of a use of such probing devices and interposers in a probe card assembly 1620, and FIG. 17 illustrates an example of such interposers in a test socket 1700.

FIG. 16 illustrates a test system 1600 for testing one or more electronic devices, that is, devices under test (DUT) 1618. The acronym DUT is short for "device under test," and DUT 1618 in FIG. 16 can be one or more electronic devices (e.g., semiconductor dies (singulated or in wafer form, packaged or unpackaged)) to be tested by tester 1602.

As shown in FIG. 16, test system 1600 can include a tester 1602 configured to control testing of DUT 1618. Tester 1602 (which can comprise electronic control equipment such as one or more computers or computer systems) can test DUT 1618 by generating test signals (e.g., power and ground and signals such as control signals, data signals, and the like to be input into DUT 1618) that are provided through communications channels 1604 and probe card assembly 1620 to ones (i.e., one, two, many, or all) of terminals 1616 of DUT 1618. The tester 1602 can evaluate response signals generated by DUT 1618 in response to the test signals. The response signals can be sensed at ones of terminals 1616 of DUT 1618 and provided to the tester 1602 through probe card assembly 828 and communications channels 1604.

Probe card assembly 1620 can comprise electrical connectors 1606 that can make electrical connections with channels 1604 and electrically conductive probes for contacting input and/or output terminals 1616 of DUT 1618. As will be seen, the probes can be contacts 102, which is how the probes are illustrated n FIG. 16. Probe card assembly 1620 can provide electrical paths between the electrical connectors 1606 (and thus channels 1604 when channels 1604 are connected to connectors 1606) and the probes (and thus input and/or output terminals 1616 of DUT 1618 when the probes are in contact with terminals 1616). Electrical connectors 1606 can be any connector suitable for making electrical connections with channels 1604. For example, electrical connectors 1606 can comprise zero-insertion-force electrical connectors, pogo-pin pads, or the like.

As shown in FIG. 16, in some embodiments, probe card assembly 1620 can comprise further a wiring substrate 1608, probing device 1100, and interposer 1612 disposed between the wiring substrate 1608 and the probing device 1100. As shown, a coupling mechanism 1614 (e.g., brackets, screws, bolts, clamps, or the like) can couple the wiring substrate 1608, probing device 1100, and interposer 1612 together. The wiring substrate 1608 can include electrically conductive paths (e.g., electrically conductive traces and/or vias) (not shown) on and/or in wiring substrate 1608 between connectors 1606 and electrically conductive terminals 1610, and probing device 1100 can include electrically conductive paths (e.g., electrically conductive traces and/or vias) (not shown) on and/or in probing device 1100 between electrically conductive terminals 1106 and contacts 102. Interposer 1612 can comprise electrically conductive contacts 1622 that contact and thereby form electrical connections with terminals 1610 and electrically conductive contacts 1624 that contact and thereby form electrical connections with terminals 1106. Although not shown in FIG. 16, contacts 1622 and contacts 1624 can be electrically connected within interposer 1612.

Wiring substrate 1608 can be a rigid or semi-rigid substrate such as a printed circuit board or the like. As shown in FIG. 16, the probing device 1100 can be the probing device shown in FIG. 11. In some embodiments, interposer 1612 can be interposer 1200 of FIG. 12. In such a case, interposer 1200 can replace interposer 1612 in FIG. 16 with contact tips 108 (rather than contacts 1622) in contact with terminals 1610 and contact tips 108' (rather than contacts 1624) in contact with terminals 1106. In other embodiments, interposer 1612 can be interposer 1300 of FIG. 13. In such a case, interposer 1300 can replace interposer 1612 in FIG. 16 with contact tips 1312 (rather than contacts 1622) in contact with terminals 1610 and contact tips 108 (rather than contacts 1624) in contact with terminals 1106. In still other embodiments, interposer 1612 can be interposer 1400 of FIG. 14. In such a case, interposer 1400 can replace interposer 1612 in FIG. 16 with contact tips 108 (rather than contacts 1622) in contact with terminals 1610 and contact tips 108' (rather than contacts 1624) in contact with terminals 1106. In yet other embodiments, interposer 1612 can be interposer 1500 of FIG. 15E. In such a case, interposer 1500 can replace interposer 1612 in FIG. 16 with contact tips 1312 (rather than contacts 1622) in contact with terminals 1610 and contact tips 108 (rather than contacts 1624) in contact with terminals 1106.

Probe card assembly 1620 illustrated in FIG. 16 is an example only, and many variations are possible. For example, probe card assembly 1620 need not include all of the components. For example, interposer 1612 need not be included, and terminals 1610 can be electrically connected directly to terminals 1106 or other means can be provided for electrically connecting terminals 1610 and terminals 1106. As another example, probe card assembly 1620 can include additional components such as one or more stiffeners (not shown), or probe card assembly 1620 can include more than one probing device 1100.

FIG. 17 illustrates a test socket 1700 for testing DUT 1708, which can be an electronic device to be tested. DUT 1708 can be, for example, a semiconductor die (packaged or unpackaged) or a stack of semiconductor dies.

As shown in FIG. 17, test socket 1700 can include a wiring substrate 1702 (e.g., a printed circuit board, a load board, or the like) with electrically conductive terminals 1706. Although not shown, terminals 1706 through wiring substrate 1702 can be connectable to a tester (not shown) for controlling testing of DUT 1708. Test socket 1700 can also include guides 1704 that hold an interposer 1712 in place such that contact tips 1716 of the interposer are in physical and electrical contact with terminals 1706. Guides 1704 can also temporarily hold DUT 1708, which can be disposed on guides 1704 and pressed against contact tips 1714 of interposer 1712 with sufficient force to form electrical connections with input and/or output terminals 1710 of DUT 1708.

Interposer 1712 can comprise electrically conductive contacts 1714 that contact and thereby form electrical connections with terminals 1710 of DUT 1708 and electrically conductive contacts 1716 that contact and thereby form electrical connections with terminals 1706 on wiring substrate 1702. Although not shown in FIG. 17, contacts 1714 and contacts 1716 can be electrically connected within interposer 1712. Interposer 1712 can thus electrically connect DUT 1708 to tester (not shown), and a tester (not shown) can then test DUT 1708.

In some embodiments, interposer 1712 can be interposer 1200 of FIG. 12. In such a case, interposer 1200 can replace interposer 1712 in FIG. 17 with contact tips 108 (rather than contacts 1714) in contact with terminals 1710 and contact tips 108' (rather than contacts 1716) in contact with terminals 1706. In other embodiments, interposer 1712 can be interposer 1300 of FIG. 13. In such a case, interposer 1300 can replace interposer 1712 in FIG. 17 with contact tips 1312 (rather than contacts 1714) in contact with terminals 1710 and contact tips 108 (rather than contacts 1716) in contact with terminals 1706. In still other embodiments, interposer 1712 can be interposer 1400 of FIG. 14. In such a case, interposer 1400 can replace interposer 1712 in FIG. 17 with contact tips 108 (rather than contacts 1714) in contact with terminals 1710 and contact tips 108' (rather than contacts 1716) in contact with terminals 1706. In yet other embodiments, interposer 1712 can be interposer 1500 of FIG. 15E. In such a case, interposer 1500 can replace interposer 1712 in FIG. 17 with contact tips 1312 (rather than contacts 1714) in contact with terminals 1710 and contact tips 108 (rather than contacts 1716) in contact with terminals 1706.

Regardless of how interposer 1712 is implemented in test socket 1700, interposer 1712 can be readily removed and replaced. Thus, for example, as interposer 1712 wears out after repeated use, the worn out interposer 1712 can be easily removed and replaced with a new interposer 1712.

Although specific embodiments and applications of the invention have been described in this specification, these embodiments and applications are examples only, and many variations are possible. For example, more or fewer than three contacts 102 can be disposed on substrate 110, wiring substrate 1102, surfaces 1208 and 1210 of wiring substrate 1202, growth substrate 1302, intermediate substrate 1304, or embedded in elastic material 802, 802', or 1516. Moreover, contacts 102 can be disposed in any desired pattern through the figures. As another example, test system 1600 and probe card 1620 are examples only and can comprise more, fewer, or different components. Moreover, there can be more of fewer than the number of connectors 1606, terminals 1610 and 1106, and contacts 1622, 1624, and 108, and DUT 1618 can have more or fewer than the number of terminals 1616 shown. As yet another example, test socket 1700 is an example only and can comprise more, fewer, or different components. Moreover, test socket can be configured to receive and test more than one DUT 1708, and DUT 1708 more or fewer than three terminals 1710. Interposer 1712 can also have more or fewer than the number of contacts 1714 and 1716 shown.

We claim:

1. An electronic device comprising:
   a substrate;
   electrically conductive contacts each attached at a first end to said substrate and extending away from said substrate to a second end, each of said contacts comprising a carbon-nanotube column of intertwined generally aligned carbon nanotube fibers; and
   an elastic material encapsulating at least partially each of said contacts,
   wherein said elastic material impregnates ones of said carbon-nanotube columns of said contacts,
   wherein said elastic material comprises an epoxy, a flexibilizer, an epoxy curative, and a solvent, and
   wherein a weight ratio of said epoxy to said flexibilizer to said epoxy curative to said solvent is about ten times said epoxy, about twenty times said flexibilizer, about three times said epoxy curative, and about six times said solvent.

2. The electronic device of claim 1, wherein said elastic material is disposed between carbon nanotube fibers inside said ones of said carbon-nanotube columns.

3. The electronic device of claim 1, wherein said elastic material encapsulates at least ninety percent of each of said contacts from said first ends.

4. The electronic device of claim 1, wherein mechanical characteristics of said contacts are substantially corresponding mechanical characteristics of said elastic material.

5. The electronic device of claim 4, wherein said mechanical characteristics include spring constant and elastic range.

6. The electronic device of claim 1, wherein:
   said carbon-nanotube columns are not by themselves fully elastic in response to forces on said second ends of said contacts, but
   said carbon-nanotube columns respond elastically to said forces on said second ends of said contacts due to said elastic material.

7. The electronic device of claim 6, wherein said elastic material is sufficiently elastic for said carbon-nanotube columns to be elastically compressed by said forces to at least sixty percent of an uncompressed length of said carbon-nanotube columns.

8. The electronic device of claim 6, wherein said elastic material is sufficiently elastic for said carbon-nanotube columns to be elastically compressed by said forces to at least forty percent of an uncompressed length of said carbon-nanotube columns.

9. The electronic device of claim 1, wherein said elastic material comprises a silicone elastomer material.

10. The electronic device of claim 1, wherein said flexibilizer has a general formula:

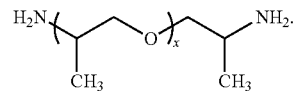

11. The electronic device of claim 1, wherein said epoxy curative has a general formula:

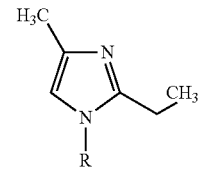

where R is one of alkyl of CnH2n+1, with n=0 to 30 or substituted alkyl of CnH2nX, with n from 0 to 30 and X being CN or NO2.

12. The electronic device of claim 1, wherein said solvent has a boiling point between 40 and 250 degrees Celsius.

13. The electronic device of claim 1, wherein said solvent comprises anisole.

14. The electronic device of claim 1, wherein said second end of each of said contacts comprises a contact tip.

15. The electronic device of claim 14, wherein said contact tip comprises a cured conductive paste.

16. The electronic device of claim 15, wherein a shape of said contact tip is generally a cone, a bullet, a cap, or a bulb.

17. The electronic device of claim 14, wherein said elastic material fully encapsulates said carbon-nanotube columns.

18. The electronic device of claim 1, wherein said substrate, said electrically conductive contacts, and said elastic material are part of a probe card assembly for connecting a tester to semiconductor dies to be tested by said tester.

19. The electronic device of claim 18, wherein said contacts are probes for contacting and thereby making electrical connections with the semiconductor dies.

20. The electronic device of claim 1, wherein said substrate, said electrically conductive contacts, and said elastic material are part of an interposer.

21. The electronic device of claim 20, wherein said interposer is part of a test socket for testing electronic devices.

22. An electronic device comprising:
a substrate;
electrically conductive contacts each attached at a first end to said substrate and extending away from said substrate to a second end, each of said contacts comprising a carbon-nanotube column of intertwined generally aligned carbon nanotube fibers; and
an elastic material encapsulating at least partially each of said contacts,
wherein said elastic material impregnates ones of said carbon-nanotube columns of said contacts,
wherein said elastic material comprises an epoxy, a flexibilizer, an epoxy curative, and a solvent, and
wherein said flexibilzer:
  comprises polypropylenglycol block and diamine, or
  has a general formula:

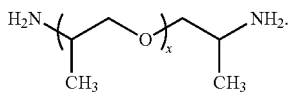

23. An electronic device comprising:
a substrate;
electrically conductive contacts each attached at a first end to said substrate and extending away from said substrate to a second end, each of said contacts comprising a carbon-nanotube column of intertwined generally aligned carbon nanotube fibers; and
an elastic material encapsulating at least partially each of said contacts,
wherein said elastic material impregnates ones of said carbon-nanotube columns of said contacts,
wherein said elastic material comprises an epoxy, a flexibilizer, an epoxy curative, and a solvent, and
wherein said epoxy has a general formula:

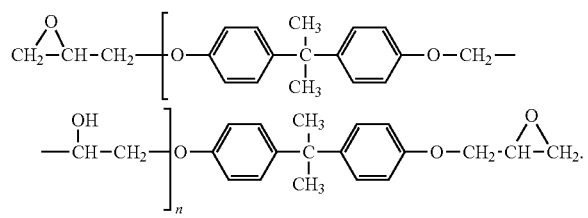

24. The electronic device of claim 23, wherein said flexibilizer has a general formula:

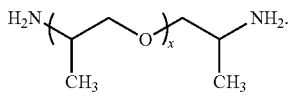

25. The electronic device of claim 24, wherein said epoxy curative has a formula:

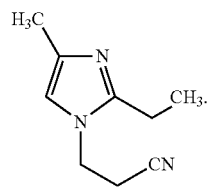

26. The electronic device of claim 24, wherein said epoxy curative has a general formula:

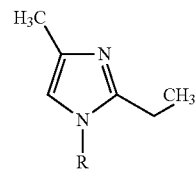

where R is one of alkyl of CnH2n+1, with n=0 to 30 or substituted alkyl of CnH2nX, with n from 0 to 30 and X being CN or NO2.

27. An electronic device comprising:
a substrate;
electrically conductive contacts each attached at a first end to said substrate and extending away from said substrate to a second end, each of said contacts comprising a carbon-nanotube column of intertwined generally aligned carbon nanotube fibers; and
an elastic material encapsulating at least partially each of said contacts,
wherein said elastic material impregnates ones of said carbon-nanotube columns of said contacts,
wherein said elastic material comprises an epoxy, a flexibilizer, an epoxy curative, and a solvent, and
wherein said epoxy curative has a formula:

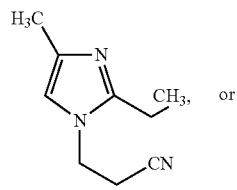 or said epoxy curative has a general formula:

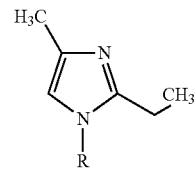

where R is one of alkyl of CnH2n+1, with n=0 to 30 or substituted alkyl of CnH2nX, with n from 0 to 30 and X being CN or NO2.

* * * * *